(12) United States Patent
Parekh et al.

(10) Patent No.: US 7,879,137 B2
(45) Date of Patent: Feb. 1, 2011

(54) LITHOGRAPHIC PROJECTION APPARATUS, PURGE GAS SUPPLY SYSTEM AND GAS PURGING METHOD

(75) Inventors: Bipin S. Parekh, Chelmsford, MA (US); Jeffrey J. Spiegelman, San Diego, CA (US); Robert S. Zeller, Boston, MA (US); Russell J. Holmes, Santee, CA (US)

(73) Assignee: Entegris, Inc., Billerica, MA (US)

( * ) Notice: Subject to any disclaimer, the term of this patent is extended or adjusted under 35 U.S.C. 154(b) by 878 days.

(21) Appl. No.: 10/565,486

(22) PCT Filed: Jul. 21, 2004

(86) PCT No.: PCT/US2004/023490

§ 371 (c)(1),
(2), (4) Date: May 4, 2006

(87) PCT Pub. No.: WO2005/010619

PCT Pub. Date: Feb. 3, 2005

(65) Prior Publication Data
US 2007/0030463 A1    Feb. 8, 2007

(51) Int. Cl.
*B01D 53/22*    (2006.01)
*G03B 21/14*    (2006.01)

(52) U.S. Cl. .................. 95/52; 96/8; 96/10; 96/11; 96/12; 261/101; 355/30; 355/53

(58) Field of Classification Search .................. 95/45, 95/52; 96/4, 8, 10, 11, 12, 13, 14; 261/101, 261/104, 97, DIG. 15, DIG. 46; 430/311, 430/327, 394, 494; 355/30, 52, 53, 55, 77; 250/492.1

See application file for complete search history.

(56) References Cited

U.S. PATENT DOCUMENTS 4,381,267 A * 4/1983 Jackson .................. 261/104

(Continued)

FOREIGN PATENT DOCUMENTS

EP    0 571 997 A    12/1993

(Continued)

OTHER PUBLICATIONS

Office Action, EP 04 757 185.6, Nov. 12, 2008.

(Continued)

*Primary Examiner*—Jason M Greene
(74) *Attorney, Agent, or Firm*—Hamilton, Brook, Smith & Reynolds, P.C.

(57) ABSTRACT

A lithographic projection apparatus (1) includes a support configured to support a patterning device (MA), the patterning device configured to pattern the projection beam according to a desired pattern. The apparatus has a substrate (W) table configure to hold a substrate, a projection system configured to project the patterned beam onto a target portion of the substrate. The apparatus also has a purge gas supply system (100) configured to provide a purge gas near a surface of a component of the lithographic projection apparatus. The purge gas supply system (100) includes a purge gas mixture generator (120) configured to generate a purge gas mixture which includes at least one purging gas and moisture. The purge gas mixture generator has a moisturizer (150) configured to add the moisture to the purge gas and a purge gas mixture outlet (130) connected to the purge gas mixture generator (120) configured to supply the purge gas mixture near the surface.

73 Claims, 9 Drawing Sheets

U.S. PATENT DOCUMENTS

| | | | | |
|---|---|---|---|---|
| 4,704,348 | A | * | 11/1987 | Koizumi et al. ............ 430/327 |
| 5,240,472 | A | * | 8/1993 | Sircar ............................ 95/52 |
| 5,348,691 | A | * | 9/1994 | McElroy et al. ............ 261/104 |
| 5,499,076 | A | | 3/1996 | Muraki |
| 5,738,808 | A | * | 4/1998 | Iwamoto .................... 261/104 |
| 5,892,572 | A | | 4/1999 | Nishi |
| 5,910,292 | A | | 6/1999 | Alvarez, Jr. et al. |
| 5,996,976 | A | * | 12/1999 | Murphy et al. ............. 261/104 |
| 6,059,859 | A | | 5/2000 | Alvarez et al. |
| 6,089,282 | A | | 7/2000 | Spiegelman et al. |
| 6,254,936 | B1 | | 7/2001 | Gurer et al. |
| 6,394,109 | B1 | | 5/2002 | Somekh |
| 6,474,628 | B1 | | 11/2002 | Stroh et al. |
| 6,514,313 | B1 | | 2/2003 | Spiegelman et al. |
| 6,582,496 | B1 | | 6/2003 | Cheng et al. |
| 6,638,341 | B1 | | 10/2003 | Spiegelman et al. |
| 6,702,941 | B1 | | 3/2004 | Haq et al. |
| 6,724,460 | B2 | | 4/2004 | Van Schaik et al. |
| 6,755,399 | B2 | * | 6/2004 | Shimanuki et al. ............ 95/52 |
| 6,762,820 | B2 | | 7/2004 | Udagawa et al. |
| 6,805,731 | B2 | | 10/2004 | Cheng et al. |
| 6,828,569 | B2 | | 12/2004 | Van Schaik et al. |
| 6,829,034 | B2 | | 12/2004 | Miwa et al. |
| 6,842,998 | B2 | * | 1/2005 | Kashkoush et al. ............ 95/52 |
| 6,887,303 | B2 | * | 5/2005 | Hesse et al. ..................... 96/8 |
| 6,913,654 | B2 | | 7/2005 | Alvarez et al. |
| 6,961,113 | B1 | | 11/2005 | Hayashi et al. |
| 7,113,254 | B2 | | 9/2006 | Van Der Net et al. |
| 7,189,291 | B2 | | 3/2007 | Spiegelman et al. |
| 7,384,149 | B2 | | 6/2008 | Van Der Net et al. |
| 7,455,721 | B2 | * | 11/2008 | Berger et al. ..................... 96/4 |
| 2002/0057423 | A1 | | 5/2002 | Nogawa |
| 2003/0035087 | A1 | | 2/2003 | Murayama |
| 2003/0162305 | A1 | | 8/2003 | Alvarez et al. |
| 2003/0192428 | A1 | | 10/2003 | Cheng et al. |
| 2003/0201223 | A1 | | 10/2003 | Cheng et al. |
| 2004/0094466 | A1 | | 5/2004 | Cheng et al. |
| 2004/0099140 | A1 | | 5/2004 | Hesse et al. |
| 2004/0237777 | A1 | | 12/2004 | Alvarez, Jr. et al. |
| 2004/0238013 | A1 | | 12/2004 | Spiegelman et al. |
| 2005/0017198 | A1 | | 1/2005 | Van Der Net et al. |
| 2005/0051739 | A1 | | 3/2005 | Van Der Net et al. |
| 2005/0205114 | A1 | | 9/2005 | Alvarez, Jr. et al. |
| 2006/0118138 | A1 | | 6/2006 | Spiegelman et al. |
| 2006/0211131 | A1 | | 9/2006 | Spiegelman et al. |
| 2006/0285091 | A1 | | 12/2006 | Parekh et al. |
| 2007/0114467 | A1 | | 5/2007 | Van der Net et al. |
| 2007/0137676 | A1 | | 6/2007 | Spiegelman et al. |

FOREIGN PATENT DOCUMENTS

| | | | |
|---|---|---|---|
| EP | 0 678 321 | A | 10/1995 |
| EP | 1 338 852 | B1 | 4/2009 |
| GB | 2 100 453 | A | 12/1982 |
| JP | 57177144 | A | 10/1982 |
| JP | 62-130321 | U | 8/1987 |
| JP | 2001-349585 | A | 12/2001 |
| JP | 2001-358055 | | 12/2001 |
| JP | 2002-147802 | A | 5/2002 |
| WO | WO 00/44479 | * | 8/2000 |
| WO | WO 2005/008339 | A2 | 1/2005 |
| WO | WO 2005/010619 | A2 | 2/2005 |
| WO | WO 2007/120451 | A1 | 10/2007 |

OTHER PUBLICATIONS

Office Action, CN 2004800210184, Feb. 20, 2009.
Office Action, EP 07 754 421.1, Jan. 27, 2009.
International Preliminary Report on Patentability, PCT/US2007/007901 dated Oct. 16, 2008.
Chemical Filtration Assemblies, Data Sheet A54a, "Infuzor Membrane Contactor Module," 2 pages, Pall Corporation, 2004.
"MH & PH—Series Humidifiers," Perma Pure Inc., Bulletin 106, 2 pages, Nov. 1998.
Nafion Membrane, "Fuel Cell Humidifiers," Perma Pure, Inc., 4 pages, 2004.
www.permapure.com, "MH & PH-Series Humidifiers," Perma Pure, Inc., 2 pages, retrieved from Internet on May 24, 2004.
www.permapure.com, PH Dimensions, "PH-Series Humidifiers—Dimensions," Perma Pure, Inc., 2 pages, retrieved from Internet on May 24, 2004.
www.permapure.com, PH-Humidifiers, "PH-Series Humidifiers—Multi-tube Humidifiers," Perma Pure, Inc., 2 pages, retrieved from Internet on May 24, 2004.
Mykrolis, "pHasor II Membrane Contactor," PFA Hollow Fiber Technology, Product Profile, 2 pages, Aug. 2003.
www.rednova.com, "Mykrolis Unveils pHasor II Membrane Contactor," 2 pages, retrieved from Internet May 24, 2004.
www.mykrolis.com, "pHasor II Membrane Contactor," 1 page, retrieved from Internet May 24, 2004.
International Search Report for PCT/2007/007901 filed Mar. 28, 2007.
U.S. Appl. No. 11/396,823, by Bipin S. Parekh, et al., filed Apr. 3, 2006.
U.S. Appl. No. 11/780,681, by Bipin S. Parekh, et al., filed Jul. 20, 2007.
International Search Report for PCT/NL2004/000519, filed Jul. 20, 2004.
Office Action dated Jun. 12, 2009 from Chinese Patent Application No. 200480021018.4.
Office Action dated Aug. 21, 2009 from Chinese Patent Application No. 200710181221.3.
Austrian Patent Office, Written Opinion, International Application No. 200806827-2, date of mailing Mar. 5, 2010.
Singapore Patent Office Written Opinion and Search Report, International Application No. SG 200802367-3, date of mailing Jan. 18, 2010.
European Patent Office Action, Communication pursuant to Article 94(3) EPC, International Application No. 04 757 185.6-1226, date of mailing Nov. 11, 2008.
The Patent Office of the People's Republic of China, Notification of First Office Action, International Application No. 200710181221.3, date of mailing Aug. 21, 2009.
Japanese Office Action, Japanese Application No. 2006-521216, mailing date Jul. 13, 2010.
Japanese Office Action, Japanese Application No. 2007-299182, mailing date Jul. 13, 2010.

* cited by examiner

LITHOGRAPHIC PROJECTION APPARATUS, PURGE GAS SUPPLY SYSTEM AND GAS PURGING METHOD

RELATED APPLICATIONS

This application is the U.S. National Stage of International Application No. PCT/US2004/023490, filed 21 Jul. 2004, published in English, and claims priority under 35 U.S.C. §119 or 365 to U.S. application Ser. No. 10/623,180, filed Jul. 21, 2003, the entire teachings of which are incorporated herein by reference.

BACKGROUND OF THE INVENTION

In general, surfaces of components present in a lithographic projection apparatus become contaminated during use, even if most of the apparatus is operated in vacuum. In particular, the contamination of optical components in a lithographic projection apparatus, such as mirrors, has an adverse effect on the performance of the apparatus, because such contamination affects the optical properties of the optical components.

It is known that contamination of optical components of a lithographic projection apparatus can be reduced by purging a space of the lithographic projection apparatus in which such a component is located with an ultra high purity gas, referred to as a purge gas. The purge gas prevents contamination of the surface, for example, molecular contamination with hydrocarbons.

A drawback of this method is that the purge gas may have an adverse effect on the activity of chemicals used in the lithographic projection process. Thus, there is a need for a modified purge gas that does not adversely affect the activity of chemicals used in lithographic processes.

SUMMARY OF THE INVENTION

It has been found that some types of radiation-sensitive material (resists), in particular, resists sensitive to ultra-violet radiation and acetal-base photo-resists, do not function properly in an environment provided with the purge gas and that these resists require moisture, e.g., water vapor, to develop. However, moisture is not present in the purge gas used in the known photolithographic methods. Thus, the known purge gas supply system for these types of resists is unsuitable. Furthermore, the purge gas may have an effect on the performance of measurement devices present in a lithographic projection apparatus, such as interferometric instruments. It has been found that because of the lack of moisture, the purge gas affects the refractive index and thereby changes the outcome of interferometric measurements as well. Further, it has been found that devices where the purge gas does not contact liquid water, such as in a membrane contactor, are useful for adding moisture to the purge gas. In particular, membrane contactors made of fused perfluorinated thermoplastics are able to humidify purge gases at high flow rates while not contributing more than 1 part per trillion of contaminants.

It is an aspect of the present invention to provide an improved lithographic projection apparatus, and in particular a lithographic projection apparatus in which contamination can be reduced with a purge gas without affecting the development of the resist.

According to one aspect of the present invention, a lithographic projection apparatus includes an illuminator configured to provide a projection beam of radiation and a support structure configured to support a patterning device. The patterning device is configured to pattern the projection beam according to a desired pattern. A substrate table is configured to hold a substrate. A projection system is configured to project the patterned beam onto a target portion of the substrate. At least one purge gas supply system is configured to provide a purge gas to at least part of the lithographic projection apparatus. The at least one purge gas supply system having a purge gas mixture generator includes a moisturizer configured to add moisture to a purge gas. The purge gas mixture generator is configured to generate a purge gas mixture. The purge gas mixture includes at least one purge gas and the moisture. A purge gas mixture outlet is connected to the purge gas mixture generator and is configured to supply the purge gas mixture to the at least part of the lithographic projection apparatus. Thus, moisture is present and the activity of chemicals, e.g. the development of the resists, is not affected by the purge gas.

According to a still further aspect of the present invention, a purge gas supply system includes a purge gas mixture generator comprising a moisturizer configured to add moisture to a purge gas, the purge gas mixture generator configured to generate a purge gas mixture including at least one purging gas and the moisture; and a purge gas outlet. In one example, the purge gas outlet is configured to supply the purge gas mixture to the at least part of a lithographic projection apparatus.

In a preferred embodiment, the purge gas mixture supply system includes a purge gas source; a water source; and a purge gas mixture generator having a moisturizer configured to add moisture to a purge gas. Optionally, the supply system also includes a heating device for the water, such that the water is heated in or prior to entering the moisturizer.

The moisturizer for the purge gas supply system and the lithographic protection apparatus preferably includes a first region containing a purge gas flow and a second region containing water where the first and second regions are separated by a gas-permeable membrane that is substantially resistant to liquid intrusion. More preferably, the moisturizer contains:

a) a bundle of a plurality of perfluorinated gas-permeable thermoplastic hollow fiber membranes having a first end and a second end, where the membranes have an outer surface and an inner surface and inner surface includes a lumen;

b) each end of the bundle potted with a liquid tight perfluorinated thermoplastic seal forming a unitary end structure with a surrounding perfluorinated thermoplastic housing where the fiber ends are open to fluid flow;

c) the housing having an inner wall and an outer wall, where the inner wall defines a fluid flow volume between the inner wall and the hollow fiber membranes;

d) the housing having a purge gas inlet connected to the purge gas source and a purge gas mixture outlet; and e) the housing having a water inlet connected to the water source and a water outlet, where either the purge gas inlet is connected to the first end of the bundle and the purge gas mixture outlet is connected to the second end of the bundle or the water inlet is connected to the first end of the bundle and the water outlet is connected to the second end of the bundle, and wherein the purge gas mixture contains at least one purge gas and the moisture.

According to another aspect of the present invention, a method for humidifying a purge gas includes passing the purge gas through the moisturizer described above for a period sufficient to humidify the purge gas. In a particular embodiment, the humidified purge gas is provided to at least a part of a lithographic projection apparatus. This method includes generating a purge gas mixture having at least one purge gas and moisture by adding moisture to a purge gas and supplying the purge gas mixture to at least a part of the lithographic projection apparatus, where the purge gas mixture includes a purge gas and moisture. Thus, chemicals used in the lithographic projection apparatus are not affected by the purge gas.

According to a further aspect of the invention, a device manufacturing method includes providing a substrate that is at least partially covered by a layer of radiation-sensitive material; applying the method described above to at least a part of the substrate; providing a patterned projection beam of radiation; projecting the patterned beam of radiation onto a target portion of the layer of radiation-sensitive material; and supplying the purge gas mixture near a surface of a component used in the device manufacturing method.

Further details, aspects and embodiments of the invention will be described, by way of example only, with reference to the attached drawings.

DETAILED DESCRIPTION OF THE INVENTION

Figure 1:
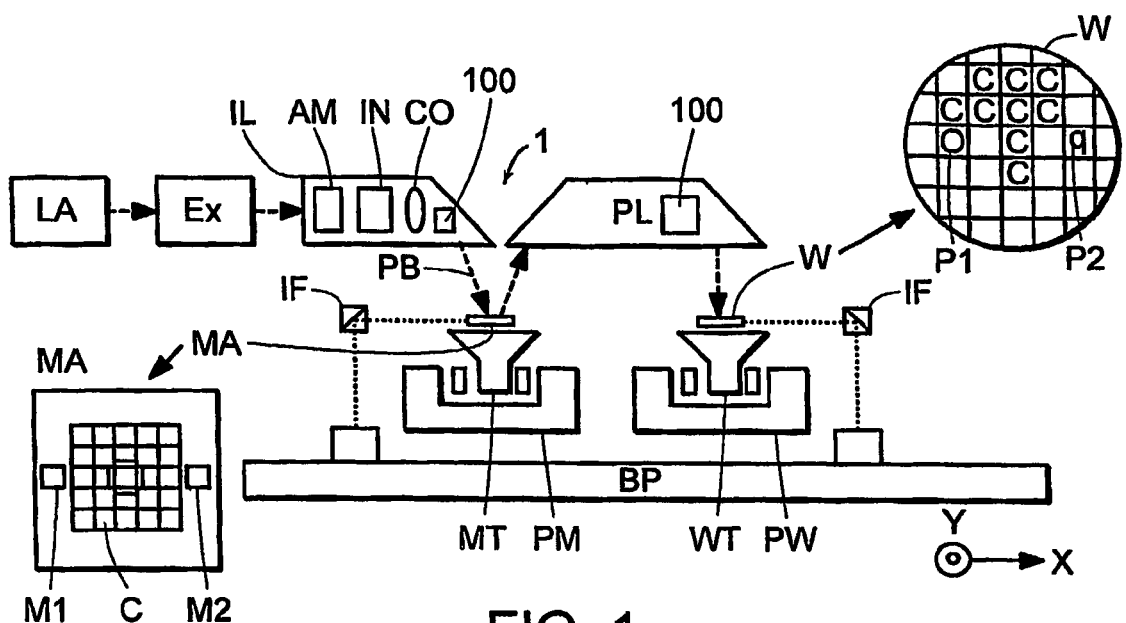
FIG. 1 schematically shows an example of an embodiment of a lithographic projection apparatus according to the present invention.

The present invention provides both an apparatus and a method for humidifying a purge gas. Although such humidified purge gases are particularly beneficial in lithographic systems, their use is not limited to such systems. Introducing water into a system by a method of the invention avoids methods of introducing water that may contaminate the purge gas.

The term "patterning device" as here employed should be broadly interpreted as referring to a device that can be used to endow an incoming radiation beam with a patterned cross-section corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support structure may be embodied as a frame or table, for example, which may be fixed or movable as required.

Another example of a patterning device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving lithographic apparatuses such as a mask and mask table. However, the general principles discussed in such instances should be seen in the broader context of the humidified purge gas generators described herein.

Lithographic projection apparatus can be used, for example, in the manufacture of integrated circuits (IC's). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In the current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g., in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices, the additional tables may be used in parallel or preparatory steps that may be carried out on one or more tables while one or more other tables are being used for exposures. Dual stage lithographic apparatuses are described, for example, in U.S. Pat. No. 5,969,441 and WO 98/40791.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill in the art will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g., with a wavelength of 365, 248, 193, 157 or 126 nm) and extreme ultra-violet (EUV) radiation (e.g., having a wavelength in the range 5-20 nm), as well as particle beams, such as ion beams or electron beams.

FIG. 1 schematically depicts a lithographic projection apparatus 1 according to an embodiment of the present invention. The apparatus 1 includes a base plate BP. The apparatus may also include a radiation source LA (e.g., EITV radiation). A first object (mask) table MT is provided with a mask holder configured to hold a mask MA (e.g., a reticle), and is connected to a first positioning device PM that accurately positions the mask with respect to a projection system or lens PL. A second object (substrate) table WT is provided with a substrate holder configured to hold a substrate W (e.g., a resist-coated silicon wafer), and is connected to a second positioning device PW that accurately positions the substrate with respect to the projection system PL. The projection system or lens PL (e.g. a mirror group) is configured to image an irradiated portion of the mask MA onto a target portion C (e.g., comprising one or more dies) of the substrate W.

As here depicted, the apparatus is of a reflective type (i.e., has a reflective mask). However, in general, it may also be of a transmissive type, for example, with a transmissive mask. Alternatively, the apparatus may employ another kind of patterning device, such as a programmable mirror array of a type as referred to above.

The source LA (e.g., a discharge or laser-produced plasma source) produces radiation. This radiation is fed into an illumination system (illuminator) IL, either directly or after having traversed a conditioning device, such as a beam expander EX, for example. The illuminator IL may include an adjusting device AM that sets the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus, as is often the case when the source LA is a mercury lamp, for example, but that it may also be remote from the lithographic projection apparatus. The radiation which it produces is led into the apparatus. This latter scenario is often the case when the source LA is an excimer laser. The present invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW and interferometer IF, the substrate table WT can be moved accurately, e.g., so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step and scan apparatus) the mask table MT may just be connected to a short stroke actuator, or may be fixed. The mask MA and the substrate W may be aligned using mask alignment marks $M_1$ and $M_2$ and substrate alignment marks $P_1$ and $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash." Instead, the mask table MT is movable in a given direction (the so-called "scan direction", e.g., the Y direction) with a speed v, so that the projection beam PB is caused to scan over a mask image. Concurrently, the substrate table WT is simultaneously moved in the same or opposite direction at a speed. V=Mv, in which M is the magnification of the lens PL (typically, M=¼ or ⅕). In this manner, a relatively large target portion C can be exposed, without having to compromise on resolution.

Figure 2:
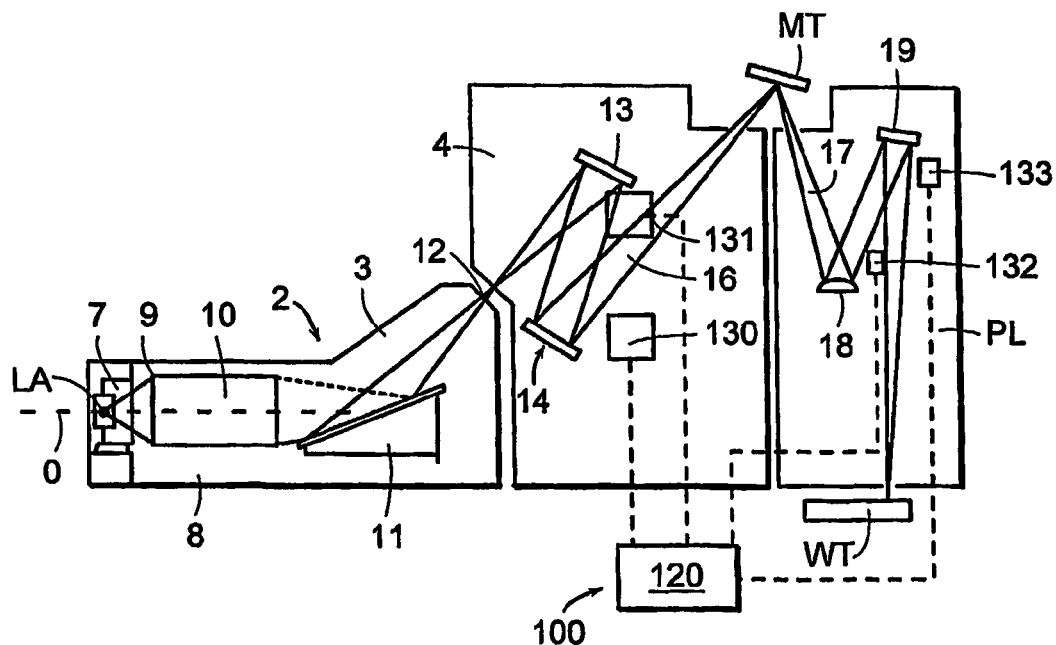
FIG. 2 shows a side view of an EUV illuminating system and projection optics of a lithographic projection apparatus according to the present invention.

FIG. 2 shows the projection system PL and a radiation system 2 that can be used in the lithographic projection apparatus 1 of FIG. 1. The radiation system 2 includes an illumination optics unit 4. The radiation system 2 can also comprise a source-collector module or radiation unit 3. The radiation unit 3 is provided with a radiation source LA that can be formed by a discharge plasma. The radiation source LA may employ a gas or vapor, such as Xe gas or Li vapor in which a very hot plasma may be created to emit radiation in the EUV range of the electromagnetic spectrum. The very hot plasma is created by causing a partially ionized plasma of an electrical discharge to collapse onto the optical axis 0. Partial pressures of 0.1 mbar of Xe, Li vapor or any other suitable gas or vapor may be required for efficient generation of the radiation. The radiation emitted by radiation source LA is passed from the source chamber 7 into collector chamber 8 via a gas barrier structure or "foil trap" 9. The gas barrier structure 9 includes a channel structure such as, for instance, described in detail in EP 1 233 468 A and EP 1 057 079 A.

The collector chamber 8 comprises a radiation collector 10, which can be a grazing incidence collector. Radiation passed by collector 10 is reflected off a grating spectral filter 11 to be focused in a virtual source point 12 at an aperture in the collector chamber 8. From chamber 8, the projection beam 16 is reflected in illumination optics unit 4 via normal incidence reflectors 13 and 14 onto a reticle or mask positioned on reticle or mask table MT. A patterned beam 17 is formed, which is imaged in projection system PL via reflective elements 18 and 19 onto a wafer stage or substrate table WT. More elements than shown may generally be present in illumination optics unit 4 and projection system PL.

As is shown in FIG. 2, the lithographic projection apparatus 1 includes a purge gas supply system 100. Purge gas outlets 130-133 of the purge gas supply system 100 are positioned in the projection system PL and the radiation system 2 near the reflectors 13 and 14 and the reflective elements 18 and 19, as is shown in FIG. 2. However, if so desired, other parts of the apparatus may likewise be provided with a purge gas supply system. For example, a reticle and one or more sensors of the lithographic projection apparatus may be provided with a purge gas supply system.

In FIGS. 1 and 2, the purge gas supply system 100 is positioned inside the lithographic projection apparatus 1. The purge gas supply system 100 can be controlled in any manner suitable for the specific implementation using any device outside the apparatus 1. However, it is likewise possible to position at least some parts of the purge gas supply system 100 outside the lithographic projection apparatus 1, for example the purge gas mixture generator 120.

Figure 3:
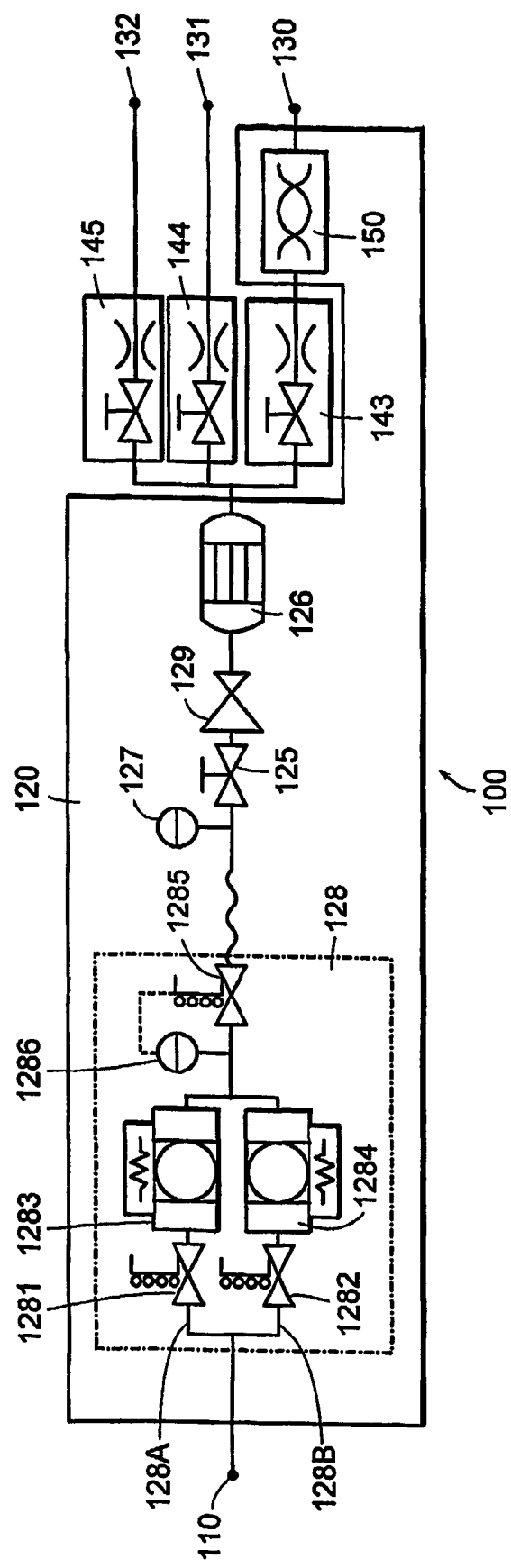
FIG. 3 schematically shows a circuit diagram of an example of a purge gas supply system according to the present invention.

FIG. 3 shows an exemplary embodiment of a purge gas supply system 100. A purge gas inlet 110 is connected to a purge gas supply apparatus (not shown) that supplies a dry gas that is substantially without moisture, for example, a pressurized gas supply circuit, a cylinder with compressed dry air or otherwise. The dry gas is fed through the purge gas mixture generator 120. In the purge gas mixture generator 120 the dry gas is purified further, as explained below. Further, the purge gas mixture generator 120 includes a moisturizer 150 which adds moisture to the dry gas for the purge gas outlet 130. The other purge gas outlets 131 and 132 are not connected to the moisturizer 150. Thus, at the purge gas outlet 130, a purge gas mixture including the purge gas and moisture is presented, whereas at the other purge gas outlets 131 and 132 only the dry purge gas is presented. Thereby the purge gas mixture may be provided only near surfaces provided with chemicals that require a moisture, such as the wafer table WT, whereas other parts of the lithographic projection apparatus 1 can be provided with a dry purge gas, i.e., without moisture. Nevertheless, the invention is not limited to purge gas mixture generators where only one outlet of the generator supplies the purge gas mixture.

Furthermore, because the moisture is added to a purge gas, properties of the purge gas mixture, such as the relative humidity or purity of the moisture, can be controlled with a good accuracy. Also, because of the moisturizer the system is flexible, as the moisturizer allows the amount of moisture present in the purge gas mixture to easily be adjusted by adding more or less moisture to the purge gas.

The purge gas mixture generator 120 includes, in a flow direction: a purifier apparatus 128, a flow meter 127, a valve 125, a reducer 129, a heat exchanger 126 and the moisturizer 150.

A compressed dry air (CDA) from a CDA source (not shown) is supplied to the purifier apparatus 128 via the purge gas inlet 110. The CDA is purified by the purifier 128. The purifier 128 includes two parallel flow branches 128A and 128B each including, in the flow direction: an automatic valve 1281 or 1282 and a regenerable purifier device 1283 or 1284. The regenerable purifier devices 1283 and 1284 are each provided with a heating element to heat and thereby regenerate the respective purifier devices 1283 and 1284. The flow branches are connected downstream of the purifier devices 1283 and 1284 to a shut-off valve 1285 that is controlled by a purity sensor 1286.

Because purifiers are regenerable, the system can be used for a long time by regenerating the purifiers in case they become saturated with the compounds removed from the purge gas. The regenerable purifiers may be of any suitable type, for example, a regenerable filter which removes contaminating compounds or particles out of a gas by a physical process, such as adsorption, catalysis or otherwise, as opposed to non regenerable chemical processes occurring in a charcoal filter, for example. In general, a regenerable purifier does not contain organic material and the regenerable purifiers typically contain a material suitable for physically binding a contaminant of the purge gas, such as metals, including zeolite, titanium oxides, gallium or palladium compounds, or others. Preferred purifiers are inert gas and oxygen-compatible purifiers such as the Aeronex Inert or XCDA purifiers (CE-70KF—I, O, or N) available from Mykrolis Corp.

The purifier devices 1283 and 1284 can alternately be put in a purifying state, in which the CDA is purified, and a regenerating state. In the regenerating state, the purifier device is regenerated by the respective heating element. Thus, for example, while the purifier device 1283 purifies the CDA, the purifier device 1284 is regenerated. The purifier apparatus 128 can thus operate continuously while maintaining a constant level of purification.

The automatic valves 1281 and 1282 are operated in correspondence with the operation of the corresponding purifier device 1283 and 1284. Thus, when a purifier device 1283 or 1284 is regenerated, the corresponding valve 1281 or 1282 is closed. When a purifier device 1283 or 1284 is used to purify, the corresponding valve 1281 or 1282 is open.

The purified CDA is fed through the shut-off valve 1285, which is controlled by the purity sensor 1286. The purity sensor 1286 automatically closes the shut-off valve 1285 when the purity of the purified CDA is below a predetermined threshold value. Thus, contamination of the lithographic projection apparatus 1 with a purge gas with insufficient purity levels is prevented automatically.

The flow of purified CDA can be monitored via the flow meter 127. The valve 125 can be used to shut-off the flow manually. The reducer 129 provides a stable pressure at the outlet of the reducer, thus a stable purge gas pressure is provided to restrictions 143-145 (via the heat exchanger 126).

The heat exchanger 126 provides a constant purified CDA temperature. The heat exchanger 126 extracts or adds heat to the purified CDA in order to achieve a gas temperature that is suitable for the specific implementation. In a lithographic projection apparatus, for example, stable processing conditions are required and the heat exchanger may thus stabilize the temperature of the purified CDA to have a gas temperature that is constant over time. Suitable conditions for the purge gas at the purge gas outlets in lithographic applications, for example, are found to be: a flow of 20-30 standard liters per minute, and/or a temperature of the purge gas of about 22 degrees Celsius and/or a relative humidity in the range of 30-60%. However, the invention is not limited to these conditions and other values for these parameters may likewise be used in a system according to the present invention.

The heat exchanger 126 is connected via restrictions 143-145 to the purge gas outlets 130-132. The restrictions 143-145 limit the gas flow, such that at each of the purge gas outlets 130-132 a desired, fixed purge gas flow and pressure is obtained. A suitable value for the purge gas pressure at the purge gas outlets is, for example, 100 mbar. It is likewise possible to use adjustable restrictions to provide an adjustable gas flow at each of the purge gas outlets 130-132.

The moisturizer 150 is connected downstream from the heat exchanger between the restriction 143 and the purge gas outlet 130. The purge gas outlet 130 is provided in the example of FIGS. 1 and 2 near the wafer table WT. The moisturizer 150 adds moisture to the purified CDA and thus provides a purge gas mixture to the outlet 130. In this example, only at a single outlet a purge gas mixture is discharged. However, it is likewise possible to discharge a purge gas mixture to two or more purge gas outlets, for example by connecting a multiple of purge gas outlets to separate moisturizers or connecting two or more outlets to the same moisturizer. It is likewise possible to provide a moisturizer at a different position in the purge gas mixture generator than is shown in FIG. 3. For example, the moisturizer 150 may be placed between the purge gas mixture generator 120 and the valve 143 instead of between the valve 143 and the purge gas outlet 130. The moisturizer 150 operates as a restriction as well and if so desired, the restriction 130 connected to the moisturizer 150 may be omitted.

Figure 4:
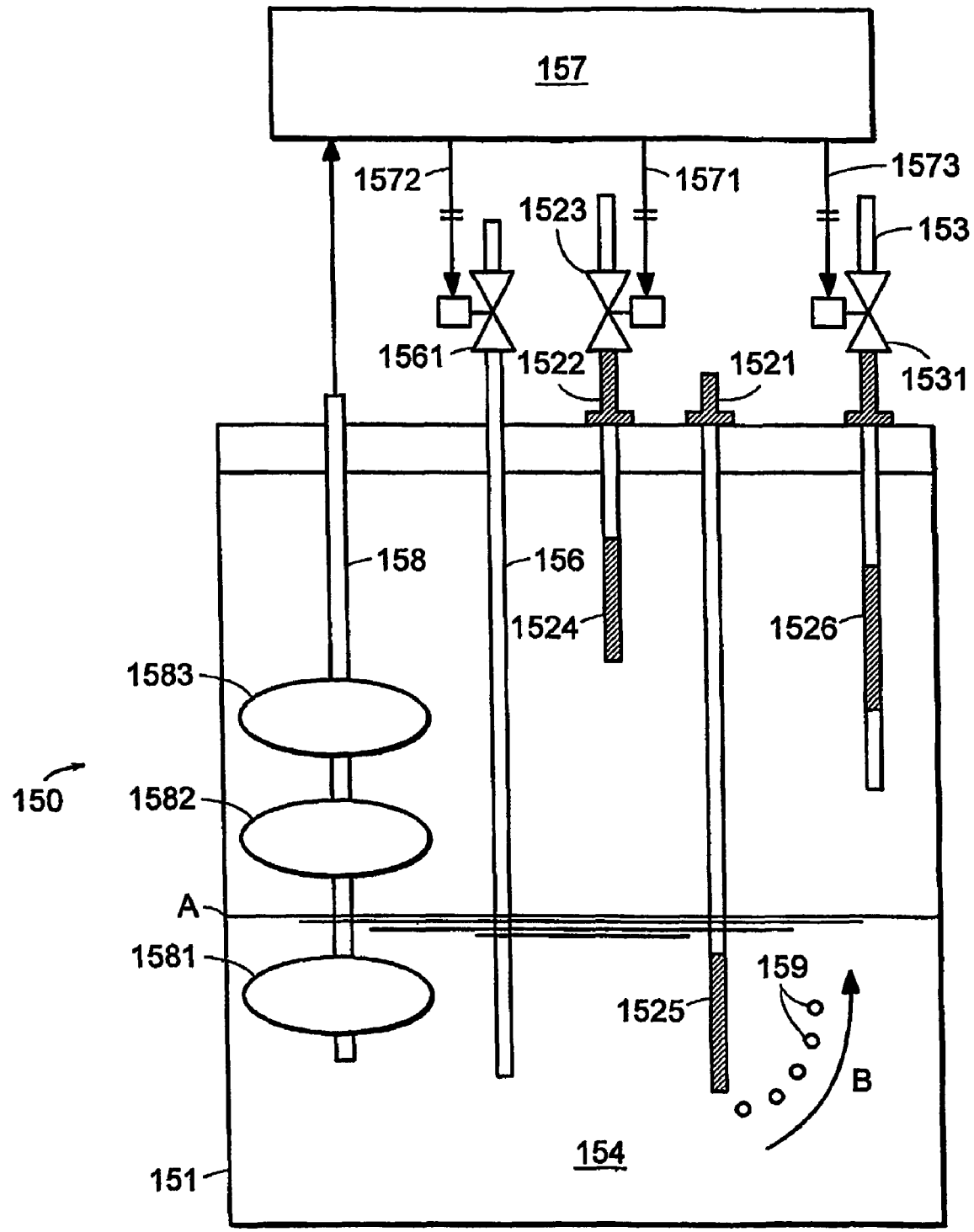
FIG. 4 schematically shows a moisturizer device suitable for use in the example of FIG. 3.

The moisturizer 150 may, for example, be implemented as shown in FIG. 4. However, the moisturizer 150 may likewise be implemented differently, and, for example, include a vaporizer which vaporizes a fluid into a flow of purge gas.

The moisturizer 150 shown in FIG. 4 includes a liquid vessel 151 which is filled to a liquid level A with a liquid 154, such as high purity water for example. A gas inlet 1521 (hereinafter "wet gas inlet 1521"), is placed mounting submerged in the liquid 154, that is below the liquid level A. Another gas inlet 1522 (hereinafter "dry gas inlet 1522"), is placed mounding above the liquid level A, that is in the part of the liquid vessel 151 not filled with the liquid 154. A gas outlet 153 connects the part of the liquid vessel 153 above the liquid 154 with other parts of the purge gas supply system 100. A purge gas, e.g. purified compressed dry air, is fed into the liquid vessel 151 via the wet gas inlet 1521. Thus, bubbles 159 of purge gas are generated in the liquid 154. Due to buoyancy, the bubbles 159 travel upwards after mounding in the liquid 154, as indicated in FIG. 4 by arrow B. During this upwards traveling period, moisture from the liquid 154 enters the bubbles 159, for example due to diffusive processes. Thus, the purge gas in the bubbles 159 is mixed with moisture. At the surface of the liquid i.e. at the liquid level A, the bubbles 159 supply their gaseous content to the gas(es) present in the liquid vessel 151 above the liquid 154. The resulting purge gas mixture is discharged from the vessel via the gas outlet 153.

The wet gas inlet 1521 is a tubular element with an outside end connected outside the liquid vessel 151 to a purge gas supply device (not shown), such as the purge gas mixture generator 120 of FIG. 3. The wet gas inlet 1521 is provided with a filter element 1525 with small, e.g. 0.5 micron, passages at an inside end which is positioned in the inside of the liquid vessel 151. The filter element 1525 is at least partially, in this embodiment entirely, placed in the liquid 154. Thus, the wet gas inlet 1521 generates a large amount of very small bubbles of purge gas. Because of their small size (e.g., about 0.5 micron), the bubbles 159 are moisturized to saturation in a relatively short time period, i.e. a relatively short traveling distance through the liquid 154.

The dry gas inlet 1522 is provided with a filter element 1524 similar to the filter element of the wet gas inlet 1521. Thereby, the gas flow through the wet gas inlet 1521 and the dry gas inlet 1522 is substantially similar, and the amount of moisture in the purge gas mixture is substantially half the amount of moisture in the bubbles 159 at the moment the bubbles 159 leave the liquid 154. That is, if the bubbles 159 are saturated with moisture, i.e., 100% relative humidity (Rh), the purge gas mixture has a 50% Rh. However, it is likewise possible to provide in a different ratio of gas flowing into the liquid vessel via the wet gas inlet 1521 and the dry gas inlet 1522 respectively and thereby adjust the relative humidity between 0-100% Rh.

The gas outlet 153 is provided at its inside end with a fine-meshed, e.g. 0.003 micron, filter 1526 which filters particles and small droplets out of the gas flowing out of the liquid vessel 151. Thus, contamination of the surface to which the purge gas mixture is supplied by such particles is reduced.

The relative amount of moisture in the purge gas mixture can be controlled in different ways. For example, parameters of the liquid vessel 151 can be controlled. Also, for example, the amount of purge gas without moisture brought into the vessel 151 via the dry gas inlet 1522 relative to the amount of purge gas with moisture generated via the wet gas inlet 1521 can be controlled. The controlled parameters of the liquid vessel 151 may for example be one or more of: the inside temperature, flow, pressure, residence time of the purge gas in the liquid.

Temperature is known to have an effect on the saturation amount of moisture that can be present in a gas, for example. To control the temperature, the liquid vessel 151 may be provided with a heating element which is controlled by a control device, or controller, in response to a temperature signal representing a temperature inside the liquid vessel provided by a temperature measuring device, for example.

The residence time of the bubbles in the liquid 154 can be changed by adjusting the position at which the gas bubbles are inserted in the liquid via the wet gas inlet 1521. For example, when the filter 1525 is positioned further into the liquid 154, the distance the bubbles have to travel to the liquid level A is increased and hence the residence time increases as well. The longer the gas bubbles are present in the liquid 154, the more moisture can be absorbed into the gas. Thus, by changing the residence time the humidity of the gas can be adapted.

The moisturizer device 150 is further provided with a control device 157 via which the amount of moisture in the purge gas mixture can be controlled. The control device 157 is connected with a moisture control contact 1571 to a control valve 1523 in the dry gas inlet 1522 via which the flow rate of the purge gas supplied to the dry inlet 1522 can be controlled and therefore the amount of dry purge gas relative to the amount of moisturized gas.

The control device 157 further controls the amount of liquid 154 present in the liquid vessel 151. The control device 157 is connected with a liquid control contact 1572 to a control valve 1561 of a liquid supply 156 and with an overflow contact 1573 to a control valve 1531 of the gas outlet 153. A liquid level measuring device 158 is communicatively connected to the control device 157. The liquid level measuring device 158 provides a liquid level signal to the control device 157 which represents a property of the liquid level in the liquid vessel 151. The control device 157 operates the control valve 1561 and the control valve 1531 in response to the liquid level signal.

In this example, the liquid level measuring device 158 includes three float switches 1581-1583 positioned at suitable, different, heights with respect to the bottom of the liquid vessel 151. A lowest float switch 1581 is positioned nearest to the bottom. The lowest float switch 1581 provides an empty signal to the control device 157 when the liquid level A is at or below the lowest float switch 1581. In response to the empty signal, the control device 157 opens the control valve 1561 and automatically liquid is supplied to the vessel.

The float switch 1582 in the middle provides a full signal in case the liquid level A reaches the height of this flow switch 1582. The control device 157 closes the control valve 1561 in response to the full signal and thereby turns off the liquid supply.

A top float switch 1583 is positioned furthest away from the bottom. The top float switch 1583 provides an overfill signal to the control device 157 in case the liquid level A is at or above the top float switch 1581. In response to the overfill, the control device 157 shuts off the control valve 1531 of the gas outlet 153 to prevent leakage of the liquid into other parts of the lithographic projection apparatus 1.

A purge gas mixture with a relative humidity above or equal to 20%, such as equal to or more than 25%, provides particularly good results with respect to the performance of photo-resists. Furthermore, a purge gas mixture with a relative humidity equal or above 25% and below 70%, such as 60%, has a good preventive effect with respect to the accuracy of measurement systems in the lithographic projection apparatus. Furthermore, it was found that a humidity, e.g. about 40%, which is similar to the humidity in the space surrounding the lithographic projection apparatus, e.g., in the clean room, provides optimal results.

Preferred moisturizers for use in the invention include a first region containing a purge gas flow and a second region containing water where the first and second regions are separated by a gas-permeable membrane that is substantially resistant to liquid intrusion. Suitable materials for the membranes include thermoplastic polymers such as poly(tetrafluoroethylene-co-perfluoro-3,6-dioxa-4-methyl-7-octene sulfonic acid) and perfluorinated polymers such as polytetrafluoroethylene. Non-wettable polymers, such as the perfluorinated polymers, are particularly preferred, especially polymers that are suitable for use with high pressure fluids and are substantially free of inorganic oxides (e.g., $SO_x$ and $NO_x$, where x is an integer from 1-3). The membranes can be a sheet, which can be folded or pleated, or can be joined at opposite sides to form a hollow fiber. It is only essential that the membrane, in combination with any sealants or adhesives used to join the membrane to a housing, prevents liquid from permeating into a purge gas under normal operating conditions (e.g., pressures of 30 psig or less). The membrane is preferably configured to maximize the surface area of the membrane contacting the purge gas and the water and minimize the volume of the membrane. A moisturizer can contain more than one membrane per device, as described below.

Moisturizers having hollow fiber membranes typically include:

a) a bundle of a plurality of gas-permeable hollow fiber membranes having a first end and a second end, where the membranes have an outer surface and an inner surface, with the inner surface encompassing one of the first and second regions;

b) each end of the bundle potted with a liquid tight seal forming an end structure with a surrounding housing where the fiber ends are open to fluid flow;

c) the housing having an inner wall and an outer wall, where the inner wall defines the other of the first and second regions between the inner wall and the hollow fiber membranes;

d) the housing having a purge gas inlet connected to the purge gas source and a purge gas mixture outlet; and e) the housing having a water inlet connected to the water source and a water outlet, wherein either the purge gas inlet is connected to the first end of the bundle and the purge gas mixture outlet is connected to the second end of the bundle or the water inlet is connected to the first end of the bundle and the water outlet is connected to the second end of the bundle.

Devices having hollow fiber membranes that are generally suitable for use as moisturizers are typically referred to as membrane contactors, and are described in U.S. Pat. Nos. 6,149,817, 6,235,641, 6,309,550, 6,402,818, 6,474,628, 6,616,841, 6,669,177 and 6,702,941, the contents of which are incorporated herein by reference. Although many of the membrane contactors are described in the preceding patents as being useful for adding gas to or removing gas from a liquid (e.g., water), Applicants have discovered that membrane contactors can generally be operated such that water vapor is added to a purge gas flow. Particular examples of membrane contactors suitable for use as moisturizers include the Infuzor®membrane contactor module marketed by Pall Corporation, Liqui-Cel® marketed by Membrana-Charlotte and Nafion® Membrane fuel cell humidifiers marketed by PermaPure LLC.

Figure 5:
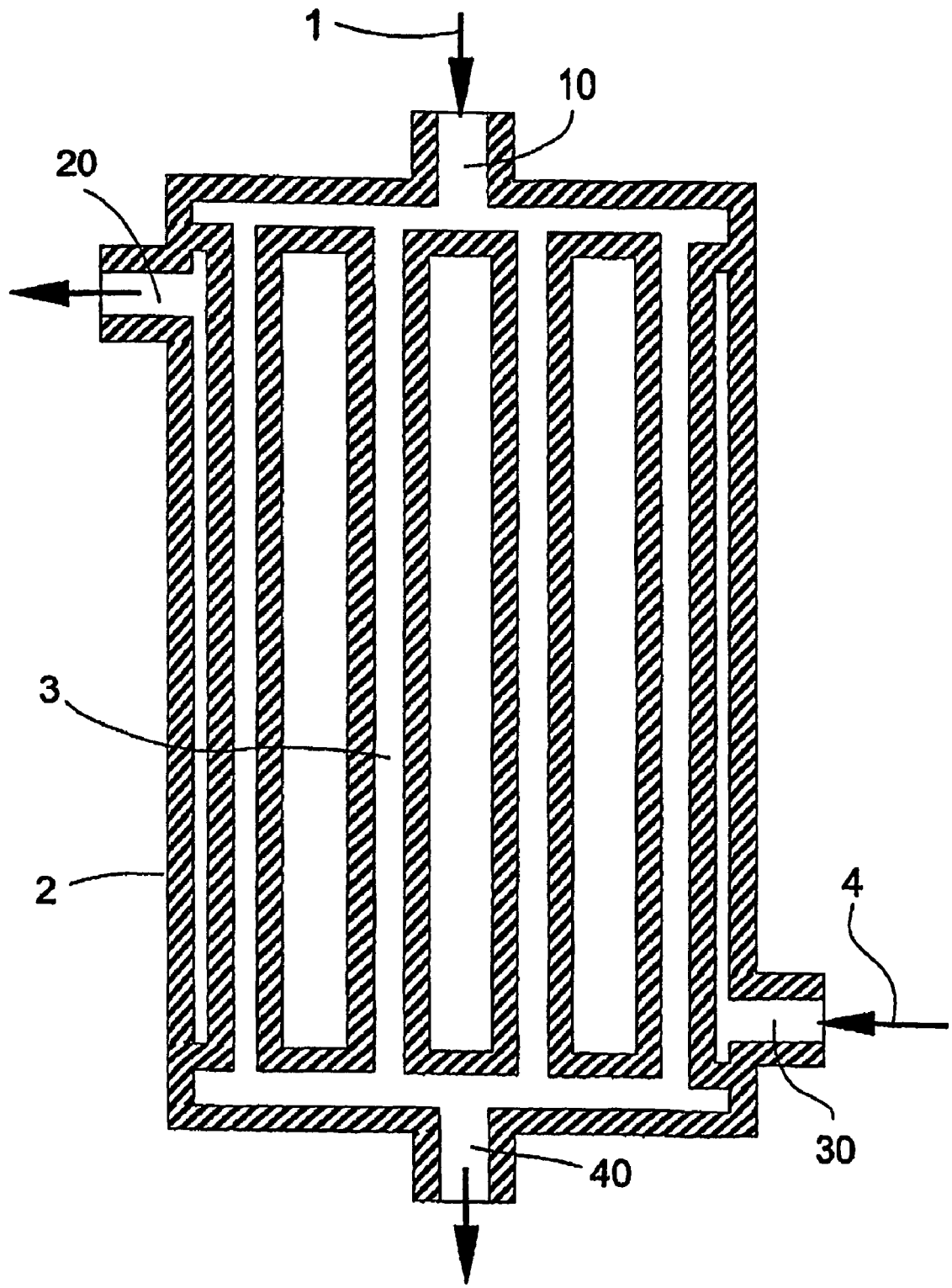
FIG. 5 is an illustration of a hollow fiber membrane moisturizer, which is more preferred for use in the example of FIG. 3.

A diagram of a particularly preferred moisturizer is shown in FIG. 5, the commercial embodiment of which is the pHasor™ II Membrane Contactor, which is marketed by Mykrolis Corporation of Billerica, Mass. As illustrated in FIG. 5, fluid 1 enters the moisturizer 2 through the fiber lumens 3, traverses the interior of the moisturizer 2 while in the lumens 3, where it is separated from fluid 4 by the membrane, and exits the contactor 2 through the fiber lumens at connection 40. Fluid 4 enters the housing through connection 30 and substantially fills the space between the inner wall of the housing and the outer diameters of the fibers, and exits through connector 20. One of the purge gas and the water is fluid 1 and the other is fluid 4. Preferably, the water is fluid 4.

The gas-permeable hollow fiber membranes used in the preferred moisturizer of the invention are typically one of the following:
  a) hollow fiber membranes having a porous skinned inner surface, a porous outer surface and a porous support structure between;
  b) hollow fiber membranes having a non-porous skinned inner surface, a porous outer surface and a porous support structure between;
  c) hollow fiber membranes having a porous skinned outer surface, a porous inner surface and a porous support structure between; or
  d) hollow fiber membranes having a non-porous skinned outer surface, a porous inner surface and a porous support structure between.

These hollow fiber membranes preferably have an outer diameter of about 350 microns to about 1450 microns.

When these hollow fiber membranes are hollow fiber membranes having a porous skinned inner surface, a porous outer surface and a porous support structure between or hollow fiber membranes having a porous skinned outer surface, a porous inner surface and a porous support structure between, the porous skinned surface pores are preferably from about 0.001 microns to about 0.005 microns in diameter. The pores in the skilled surface preferably face the liquid flow.

Suitable materials for these hollow fiber membranes include perfluorinated thermoplastic polymers such as poly(tetrafluoroethylene-co-perfluoro(alkylvinylether)) (poly(PTFE-CO-PFVAE)), poly(tetrafluoroethylene-co-hexafluoropropylene) (FEP) or a blend thereof, because these polymers are not adversely affected by severe conditions of use. PFA Teflon® is an example of a poly(PTFE-CO-PFVAE)) in which the alkyl is primarily or completely the propyl group. FEP Teflon® is an example of poly(FEP). Both are manufactured by DuPont. Neoflon™ PFA (Daikin Industries) is a polymer similar to DuPont's PFA Teflon®. A poly(PTFE-CO-PFVAE) in which the alkyl group is primarily methyl is described in U.S. Pat. No. 5,463,006, the contents of which are incorporated herein by reference. A preferred polymer is Hyflon® poly(PTFE-CO-PFVAE) 620, obtainable from Ausimont USA, Inc., Thorofare, N.J. Methods of forming these polymers into hollow fiber membranes are disclosed in U.S. Pat. Nos. 6,582,496 and 4,902,456, the contents of which are incorporated herein by reference.

Potting is a process of forming a tube sheet having liquid tight seals around each fiber. The tube sheet or pot separates the interior of the moisturizer from the environment. The pot is thermally bonded to the housing vessel to produce a unitary end structure. A unitary end structure is obtained when the fibers and the pot are bonded to the housing to form a single entity consisting solely of perfluorinated thermoplastic materials. The unitary end structure comprises the portion of the fiber bundle which is encompassed in a potted end, the pot and the end portion of the perfluorinated thermoplastic housing, the inner surface of which is congruent with the pot and bonded to it. By forming a unitary structure, a more robust moisturizer is produced, less likely to leak or otherwise fail at the interface of the pot and the housing. Moreover, forming a unitary end structure avoids the need to use adhesives such as epoxy to bond the fibers in place. Such adhesives typically include volatile hydrocarbons, which contaminate the purge gas flowing through the moisturizer. For example, purge gas humidified using a Liqui-cel moisturizer marketed by Perma Pure noticeably smelled of epoxy, which clearly indicates an unacceptable hydrocarbon content in the purge gas, likely in the hundreds of ppm. The potting and bonding process is an adaptation of the method described in U.S. Application No. 60/117,853 filed Jan. 29, 1999 and is disclosed in U.S. Pat. No. 6,582,496, the teachings of which are incorporated by reference. The bundles of hollow fiber membranes are preferably prepared such that the first and second ends of the bundle are potted with a liquid tight perfluoronated thermoplastic seal forming a single unitary end structure comprising both the first and second ends with a surrounding perfluorinated thermoplastic housing where the fibers of the ends are separately open to fluid flow.

Purge gas mixture supply systems are typically capable of operation at a purge gas flow rate of at least about 30 standard liters per minute and a temperature of at least about 90° C. When heated water is used in the moisturizer, the water temperature is preferably at least 30° C., namely at least about 35° C., such as at least about 50° C. or at least about 60° C. Flow rates of purge gas through the moisturizer are typically at least about 20 standard liters per minute (slm), for example, at least about 60 slm.

Purge gas mixtures (humidified purge gas) exiting a preferred moisturizer of the invention preferably can have a relative humidity of at least about 20%. Higher relative humidity values of at least about 50% or about 100% (to produce a substantially saturated purge gas) are possible, depending upon the conditions under which the moisturizer is operated. For example, higher stabilized relative humidity values are reached by lengthening the time a purge gas resides in the moisturizer (e.g., by reducing the flow rate or increasing the size of the moisturizer) or heating the moisturizer or at least the water in the moisturizer. The gas pressure and flow of water across a membrane can be further controlled by a mass flow controller. In particular, lowering the pressure of the purge gas results in increased humidification of the purge gas. When the purge gas pressure is decreased, the need to heat the water to obtain a high relative humidity is lessened.

As with the moisturizer shown in FIG. 4, the moisturizer device of FIG. 5 can be provided with a control device via which the amount of moisture in the purge gas mixture can be controlled. The control device is connected with a moisture control contact to a control valve via which the flow rate of unhumidified purge gas supplied (e.g., direct from the purge gas source) to a mixing chamber with humidified purge gas exiting the moisturizer of FIG. 5 can be controlled.

Purge gas mixture generators of the invention are advantageously heated for a sufficient length of time at a temperature sufficient to substantially remove compounds that volatilize at temperatures of about 100° C. or less. This allows their use in applications where essentially contaminant-free gas is required. For purposes of the present invention, a purge gas is defined as a gas or a mixture of gas having contaminant levels of no greater than 1 ppb. Purge gases include inert gases such as nitrogen and argon, along with oxygen-containing gases such as compressed dry air and clean dry gas. An appropriate purge gas is determined relative to the intended application, such that non-inert gases such as oxygen are not contaminants in certain uses but are considered contaminants in other uses. Preferably, the purge gas mixture generators (and moisturizers) do not contribute contaminants to a purge gas. For example, a purge gas containing no greater than about 1 ppb (or about 100 parts per trillion (ppt)) of contaminants exits the moisturizer as a humidified purge gas containing no greater than about 1 ppb (or 100 ppt) of contaminants. It has been found that a particular moisturizer of the invention (see Example 1) is capable of humidifying a purge gas, such that contaminant levels remain less than 1 ppt.

Water used in water sources of the invention is preferably UHP water (e.g., Millipore MilliQ water) that is distilled and filtered.

EXEMPLIFICATION

Example 1

A Mykrolis® pHasor II membrane contactor was tested for the release of non-methane hydrocarbon and sulfur compounds. A membrane contactor that does not release contaminants may be used for moisture addition to a XCDA® gas stream (less than 1 part-per-trillion (ppt) for hydrocarbon and sulfur compounds).

Figure 6:
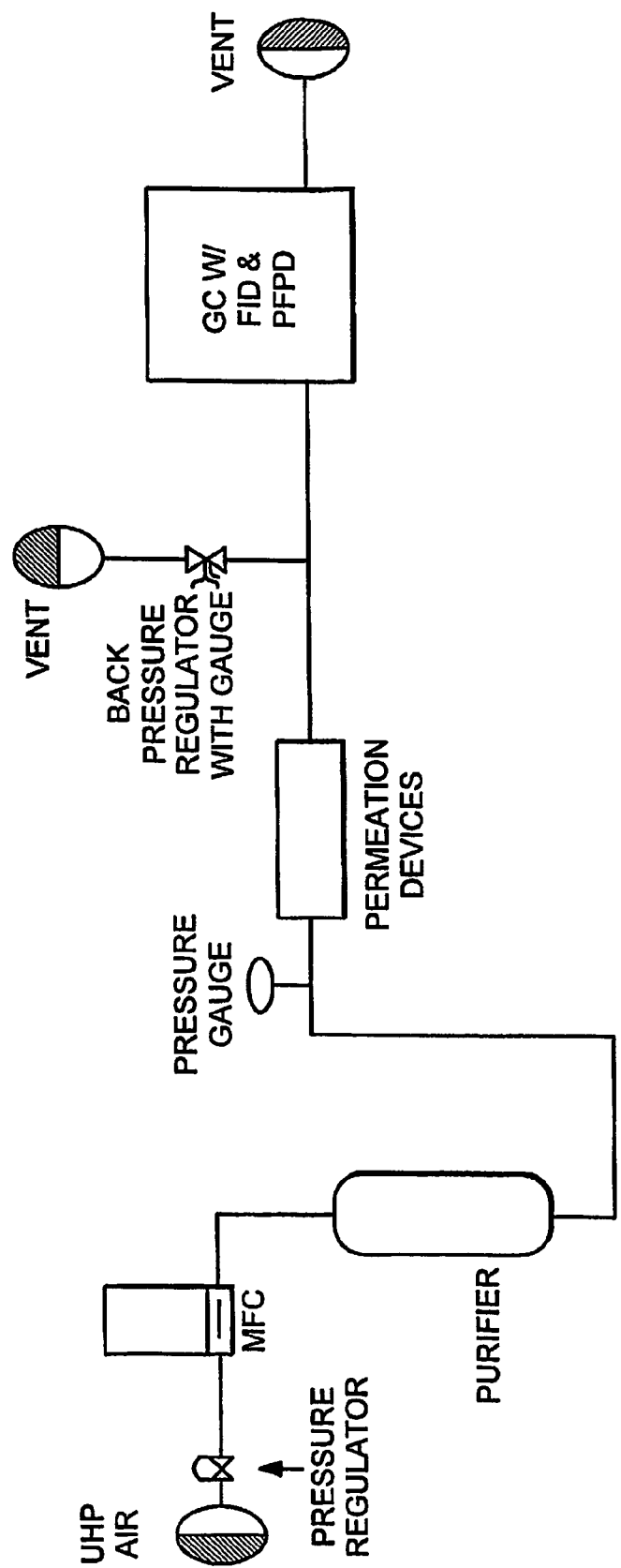
FIG. 6 shows the membrane contactor test manifold used in Example 1.

The pHasor II was cleaned to remove volatile compounds. FIG. 6 represents the experimental setup for measuring contaminants in the humidified purge gas from the pHasor II. A pressure regulator was used to maintain the pressure of the gas upstream of the mass flow controller (MFC). A MFC was used to maintain the flow rate of the air through the lumen side of the pHasor II. A purifier was used to remove contaminants from the gas upstream of the pHasor II to produce an XCDA purge gas. A pressure gauge upstream of the pHasor II was used to monitor the inlet pressure. A backpressure regulator was used to maintain the outlet pressure of the pHasor II. The shell side of the pHasor II was not filled with water. The water was removed from the pHasor II during this test since high concentrations of moisture will destabilize the detectors. A Gas Chromatograph with a Flame Ionization Detector and Pulsed Flame Photometric Detector (GC/FID/PFPD) was used to measure the concentration of hydrocarbons and sulfur compounds in the pHasor II's effluent. A cold trap method was used to concentrate hydrocarbon and sulfur compounds, which reduces the lower detection limit to 1 ppt concentration levels.

Figure 7:
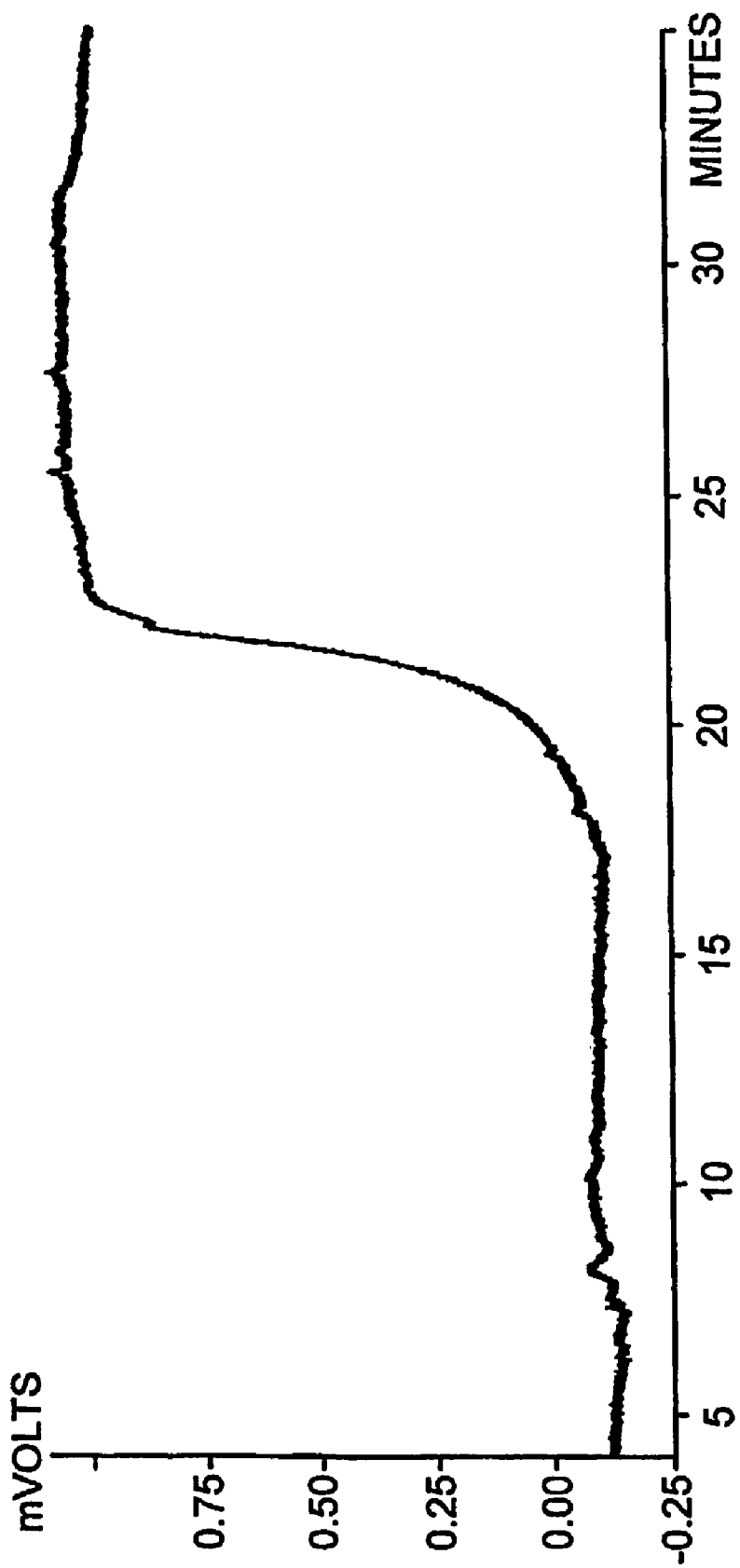
FIG. 7 shows the gas chromatography/flame ionization detector (GC/FED) reading for extra-clean dry air (XCDA).
Figure 8:
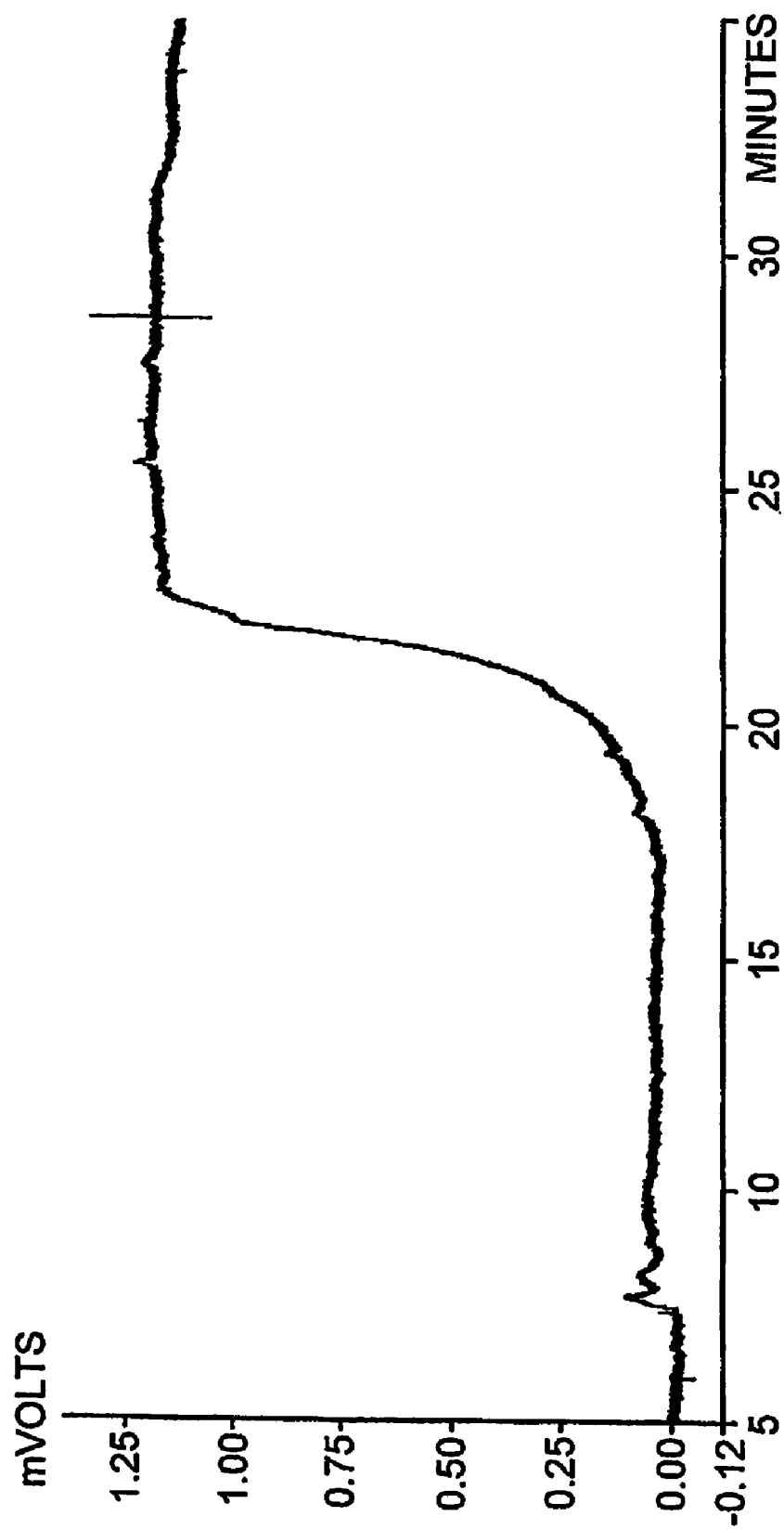
FIG. 8 shows the GC/FID reading for XCDA that has passed through a moisturizer, as described in Example 1.

FIG. 7 represents a clean background reading of less than 1 ppt of hydrocarbon contaminants using the GC/FID. FIG. 8 represents the GC/FID reading downstream of the pHasor II. As shown, both readings are basically identical. Therefore, the less than 1 ppt of hydrocarbon contamination concentration is maintained when XCDA is flowing through a pHasor II.

Figure 9:
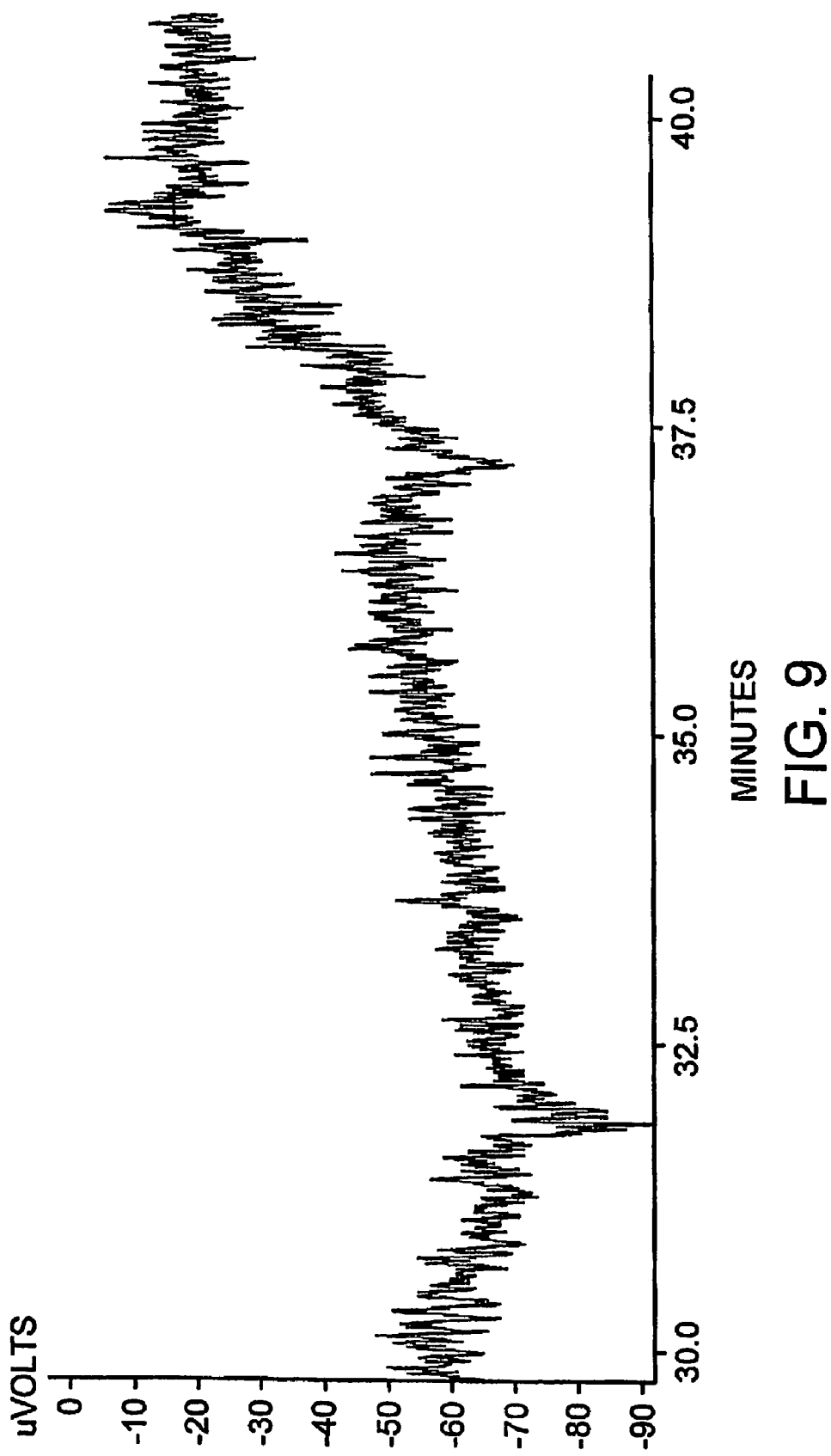
FIG. 9 shows the gas chromatography/pulse flame photometric detector (GC/PFPD) reading for XCDA.
Figure 10:
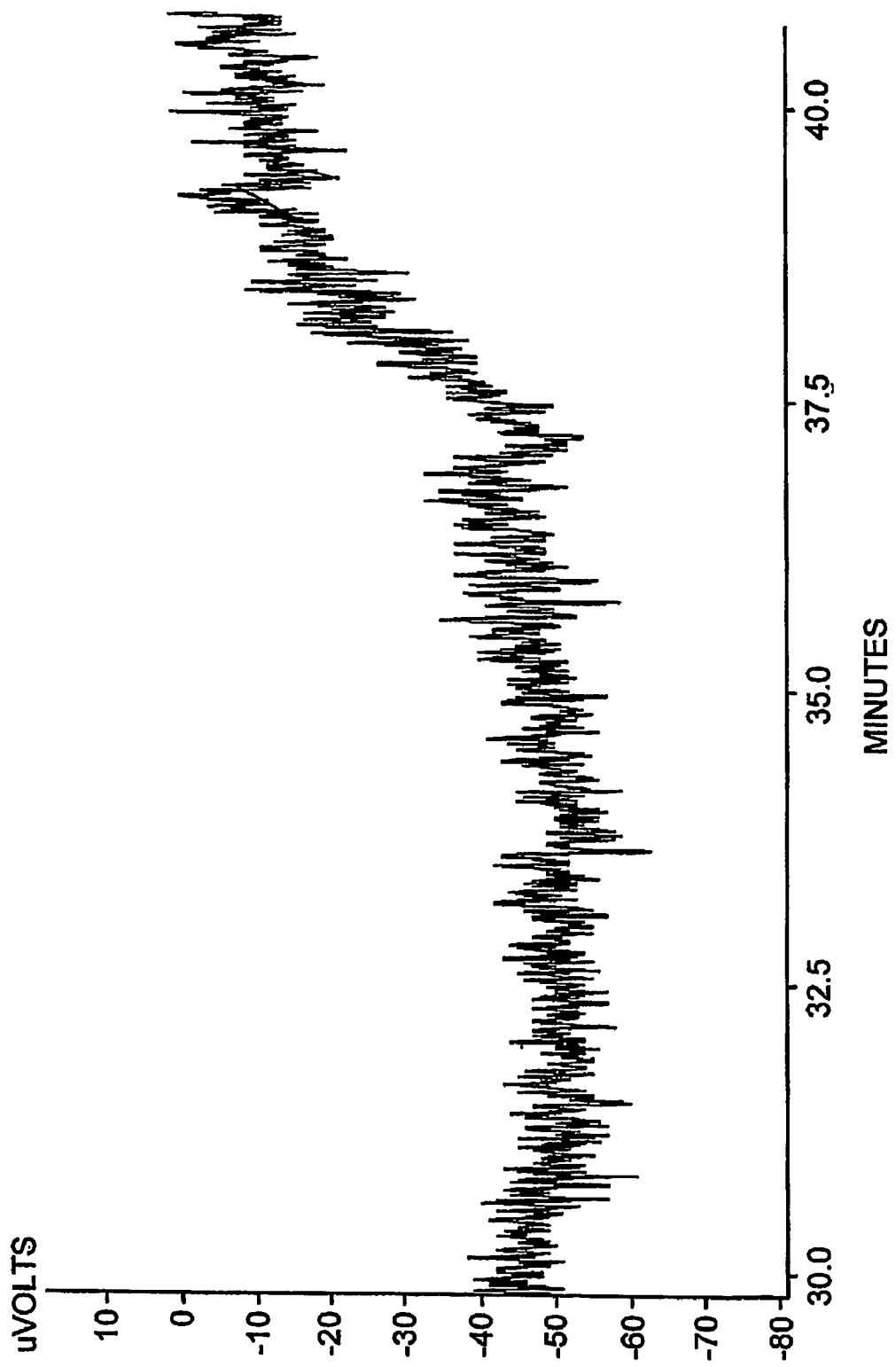
FIG. 10 shows the GC/PFPD reading for XCDA that has passed through a moisturizer, as described in Example 1.

FIG. 9 represents a clean background reading of less than 1 ppt of sulfur contaminants using the GC/PFPD. FIG. 10 represents the GC/PFPD reading downstream of the pHasor II. As shown, both readings are basically identical. Therefore, the less than 1 ppt concentration for sulfur contamination is maintained when XCDA is flowing through a pHasor II.

The pHasor II's effluent contains less than 1 ppt of non-methane hydrocarbons and less than 1 ppt of sulfur compounds. Therefore, the pHasor II can be used downstream of a purifier without effecting the integrity of a XCDA purge gas.

Example 2

A Mykrolis pHasor II membrane contactor was used to humidify clean dry air (CDA) using varied water temperatures, CDA flow rates and CDA pressures. For all experiments, the pHasor II was cleaned to remove volatile compounds. A MFC was used to maintain the flow rate of the air through the lumen side of the pHasor II. Deionized water was used in the shell side of the pHasor II, which was heated using a heat exchanger. Water flow was controlled using a regulator on the outlet side of the pHasor. Water temperature was measured on the inlet and outlet sides of the pHasor II and purge gas pressure, temperature and relative humidity were measured on the outlet side of the pHasor II.

In the first experiment, the temperature of the water was varied for different flow rates of CDA. The CDA used for this experiment had a back pressure of 20 psi, an initial temperature of 19° C. and a relative humidity of 6%. The house deionized water flowed through the pHasor II at a rate of 160 mL/min. The results of the first experiment are shown in Tables 1-3:

TABLE 1

Humidification of CDA Having 40 SLM Flow Rate

| Water Temp. (° C.) | Relative Humidity (%) | Outlet Gas Temperature (° C.) |
|---|---|---|
| 24 | 42 | 20 |
| 27 | 49 | 20 |
| 30 | 52 | 21 |
| 33 | 60 | 21 |
| 36 | 68 | 23 |
| 39 | 83 | 22 |
| 41 | 92 | 23 |
| 42 | 98 | 23 |

TABLE 2

Humidification of CDA Having 70 SLM Flow Rate

| Water Temp. (° C.) | Relative Humidity (%) | Outlet Gas Temperature (° C.) |
|---|---|---|
| 24 | 40 | 21 |
| 27 | 44 | 21 |
| 30 | 47 | 22 |
| 33 | 58 | 22 |
| 36 | 60 | 24 |
| 39 | 75 | 23 |
| 41 | 81 | 24 |
| 42 | 90 | 24 |

TABLE 3

Humidification of CDA Having 100 SLM Flow Rate

| Water Temp. (° C.) | Relative Humidity (%) | Outlet Gas Temperature (° C.) |
|---|---|---|
| 24 | 40 | 20 |
| 27 | 40 | 21 |
| 30 | 41 | 22 |
| 33 | 46 | 23 |
| 36 | 50 | 24 |

TABLE 3-continued

Humidification of CDA Having 100 SLM Flow Rate

| Water Temp. (° C.) | Relative Humidity (%) | Outlet Gas Temperature (° C.) |
|---|---|---|
| 39 | 55 | 25 |
| 41 | 62 | 26 |
| 42 | 65 | 26 |

In the second experiment, the back pressure of CDA in the pHasor II was varied. The CDA used for this experiment had an initial temperature of 19° C. and a relative humidity of 1%. The house deionized water was heated to 35° C. and flowed through the pHasor II at a rate of 156 mL/min. The results of the first experiment are shown in Tables 4-6:

TABLE 4

Humidification of CDA Having 50 SLM Flow Rate

| CDA Pressure (psig) | Relative Humidity (%) | Temperature (° C.) |
|---|---|---|
| 10 | 98 | 23 |
| 15 | 80 | 23 |
| 20 | 63 | 23 |
| 25 | 55 | 22 |

TABLE 5

Humidification of CDA Having 70 SLM Flow Rate

| CDA Pressure (psig) | Relative Humidity (%) | Temperature (° C.) |
|---|---|---|
| 5 | 98 | 24 |
| 10 | 88 | 23 |
| 15 | 74 | 23 |
| 20 | 60 | 22 |
| 25 | 51 | 22 |

TABLE 6

Humidification of CDA Having 100 SLM Flow Rate

| CDA Pressure (psig) | Relative Humidity (%) | Temperature (° C.) |
|---|---|---|
| 5 | 68 | 26 |
| 10 | 68 | 24 |
| 15 | 60 | 24 |
| 20 | 51 | 24 |
| 25 | 46 | 24 |

The first experiment demonstrates that humidification of a purge gas increases as the water temperature increases. The most significant increases in relative humidity of CDA were observed when the water temperature was 30° C. or greater. Water temperature has a lesser effect on humidification at temperatures of less than 30° C.

The second experiment demonstrates that a purge gas is more rapidly saturated with moisture when the back pressure of purge gas in a membrane contactor is decreased. This effect is roughly linear over the pressure range tested.

While this invention has been particularly shown and described with references to preferred embodiments thereof, it will be understood by those skilled in the art that various changes in form and details may be made therein without departing from the scope of the invention encompassed by the appended claims.

What is claimed is:

1. A purge gas mixture supply system, comprising:
    a purge gas mixture generator comprising a moisturizer configured to add moisture to a purge gas, wherein said moisturizer comprises a first region containing a purge gas flow and a second region containing water wherein the first and second regions are separated by a membrane contactor that forms a hollow fiber that is gas permeable and substantially resistant to liquid intrusion, one of the first and second regions being within the fiber and the other of the first and second regions being outside the fiber;
    the purge gas mixture generator being configured to add the moisture to the purge gas by further comprising a mass flow controller to control flow rate of the purge gas flow through the first region of the moisturizer and a pressure regulator to control flow of the water through the second region of the moisturizer such that the moisture is added to the purge gas to create a humidified purge gas mixture; and
    a purge gas mixture outlet being connected to the purge gas mixture generator to supply the humidified purge gas mixture to at least part of a lithographic projection apparatus.

2. The supply system of claim 1, wherein the membrane contactor is comprised of a thermoplastic polymer.

3. The supply system of claim 1, wherein the membrane contactor is comprised of a perfluorinated polymer.

4. The supply system of claim 3, wherein the perfluorinated polymer is polytetrafluoroethylene.

5. The supply system of claim 1, wherein the moisturizer comprises:
    a) a bundle of a plurality of gas-permeable hollow fiber membranes having a first end and a second end, said membranes having an outer surface and an inner surface, said inner surface comprising one of the first and second regions;
    b) each end of said bundle potted with a liquid tight seal forming an end structure with a surrounding housing wherein the fiber ends are open to fluid flow;
    c) said housing having an inner wall and an outer wall, wherein the inner wall defines the other of the first and second regions between the inner wall and the hollow fiber membranes;
    d) said housing comprising a purge gas inlet connected to a purge gas source, and comprising the purge gas mixture outlet; and
    e) said housing comprising a water inlet connected to a water source, and comprising a water outlet, wherein either the purge gas inlet is connected to the first end of the bundle and the purge gas mixture outlet is connected to the second end of the bundle or the water inlet is connected to the first end of the bundle and the water outlet is connected to the second end of the bundle,
    and wherein said purge gas mixture comprises at least one purge gas and the moisture.

6. A purge gas mixture supply system, comprising:
    a purge gas mixture generator comprising a moisturizer configured to add moisture to a purge gas, wherein said moisturizer comprises:
    a) a bundle of a plurality of perfluorinated gas-permeable thermoplastic hollow fiber membranes having a first end and a second end and being substantially resistant to liquid intrusion, said membranes having an outer surface and an inner surface, said inner surface comprising a lumen;

b) each end of said bundle potted with a liquid tight perfluorinated thermoplastic seal forming a unitary end structure with a surrounding perfluorinated thermoplastic housing wherein the fiber ends are open to fluid flow;

c) said housing having an inner wall and an outer wall, wherein the inner wall defines a fluid flow volume between the inner wall and the hollow fiber membranes;

d) said housing comprising a purge gas inlet connected to a purge gas source, and comprising a purge gas mixture outlet; and e) said housing comprising a water inlet connected to a water source, and comprising a water outlet, wherein either the purge gas inlet is connected to the first end of the bundle and the purge gas mixture outlet is connected to the second end of the bundle or the water inlet is connected to the first end of the bundle and the water outlet is connected to the second end of the bundle, and wherein said purge gas mixture comprises at least one purge gas and the moisture;

the purge gas mixture generator being configured to add the moisture to the purge gas by further comprising a mass flow controller to control flow rate of the purge gas flow through the moisturizer and a pressure regulator to control flow of the water through the moisturizer such that the moisture is added to the purge gas to create a humidified purge gas mixture; and the purge gas mixture outlet being connected to the purge gas mixture generator to supply the humidified purge gas mixture to at least part of a lithographic projection apparatus.

7. The supply system of claim 6, further comprising a heating device for the water.

8. The supply system of claim 6, wherein the purge gas source comprises a purifier device.

9. The supply system of claim 8, wherein the purifier device is regenerable.

10. The supply system of claim 9, wherein the purge gas source comprises two purifier devices and wherein the purifier devices are connected in parallel.

11. The supply system of claim 6, wherein the hollow fiber membranes are selected from the group consisting of:

a) hollow fiber membranes having a porous skinned inner surface, a porous outer surface and a porous support structure between;

b) hollow fiber membranes having a non-porous skinned inner surface, a porous outer surface and a porous support structure between;

c) hollow fiber membranes having a porous skinned outer surface, a porous inner surface and a porous support structure between; and d) hollow fiber membranes having a non-porous skinned outer surface, a porous inner surface and a porous support structure between.

12. The supply system of claim 11, wherein the hollow fiber membrane outer diameter is about 350 microns to about 1450 microns.

13. The supply system of claim 12, wherein the hollow fiber membranes are hollow fiber membranes having a porous skinned inner surface, a porous outer surface and a porous support structure between; or hollow fiber membranes having a porous skinned outer surface, a porous inner surface and a porous support structure between; and the porous skinned surface pores are from about 0.001 microns to about 0.005 microns in diameter.

14. The supply system of claim 6, wherein the first and second ends of the bundle are potted with a liquid tight perfluorinated thermoplastic seal forming a single unitary end structure comprising both the first and second ends with a surrounding perfluorinated thermoplastic housing wherein the fibers of the ends are separately open to fluid flow.

15. The supply system of claim 6, wherein said supply system is capable of operation at a purge gas flow rate of at least about 30 standard liters per minute and a temperature of at least about 90° C.

16. The supply system of claim 6, wherein the purge gas mixture generator is heated for a sufficient length of time at a temperature sufficient to substantially remove compounds that volatilize at temperatures of about 100° C. or less.

17. A method of humidifying a purge gas, comprising:

passing the purge gas through a moisturizer for a period sufficient to humidify the purge gas, wherein the moisturizer comprises a first region containing a purge gas flow and a second region containing water wherein the first and second regions are separated by a gas-permeable membrane that forms a hollow fiber and is substantially resistant to liquid intrusion, one of the first and second regions being within the fiber and the other of the first and second regions being outside the fiber;

controlling flow rate of the purge gas flow through the first region of the moisturizer with a mass flow controller and controlling flow of the water through the second region of the moisturizer with a pressure regulator such that moisture is added to the purge gas to create a humidified purge gas mixture; and supplying the humidified purge gas mixture to at least part of a lithographic projection apparatus.

18. A method of humidifying a purge gas, comprising passing the purge gas through a moisturizer for a period sufficient to humidify the purge gas, wherein the moisturizer comprises:

a) a bundle of a plurality of perfluorinated gas-permeable thermoplastic hollow fiber membranes having a first end and a second end and being substantially resistant to liquid intrusion, said membranes having an outer surface and an inner surface, said inner surface comprising a lumen;

b) each end of said bundle potted with a liquid tight perfluorinated thermoplastic seal forming a unitary end structure with a surrounding perfluorinated thermoplastic housing wherein the fiber ends are open to fluid flow;

c) said housing having an inner wall and an outer wall, wherein the inner wall defines a fluid flow volume between the inner wall and the hollow fiber membranes;

d) said housing comprising a purge gas inlet connected to a purge gas source, and comprising a purge gas outlet; and e) said housing having a water inlet connected to a water source and a water outlet, wherein either the purge gas inlet is connected to the first end of the bundle and the purge gas outlet is connected to the second end of the bundle or the water inlet is connected to the first end of the bundle and the water outlet is connected to the second end of the bundle, thereby obtaining a humidified purge gas;

the method further comprising controlling flow rate of the purge gas flow through the moisturizer with a mass flow controller and controlling flow of the water through the moisturizer with a pressure regulator such that moisture is added to the purge gas; and supplying the humidified purge gas through the purge gas outlet to at least part of a lithographic projection apparatus.

19. A lithographic projection apparatus, comprising:

an illuminator configured to provide a projection beam of radiation;

a support structure configured to support a patterning device, the patterning device configured to pattern the projection beam according to a desired pattern;
a substrate table configured to hold a substrate;
a projection system configured to project the patterned beam onto a target portion of the substrate; and
at least one purge gas supply system configured to provide a purge gas to at least part of the lithographic projection apparatus, the at least one purge gas supply system comprising:
a purge gas mixture generator comprising a moisturizer configured to add moisture to a purge gas, wherein the moisturizer comprises a first region containing a purge gas flow and a second region containing water wherein the first and second regions are separated by a gas-permeable membrane that forms a hollow fiber and is substantially resistant to liquid intrusion, one of the first and second regions being within the fiber and the other of the first and second regions being outside the fiber, the purge gas mixture generator configured to generate a purge gas mixture, which purge gas mixture comprises at least one purge gas and the moisture, the purge gas mixture generator being configured to add the moisture to the purge gas by further comprising a mass flow controller to control flow rate of the purge gas flow through the first region of the moisturizer and a pressure regulator to control flow of the water through the second region of the moisturizer such that the moisture is added to the purge gas; and
a purge gas mixture outlet connected to the purge gas mixture generator configured to supply the purge gas mixture to the at least part of the lithographic projection apparatus.

20. A lithographic projection apparatus, comprising:
an illuminator configured to provide a projection beam of radiation;
a support structure configured to support a patterning device, the patterning device configured to pattern the projection beam according to a desired pattern;
a substrate table configured to hold a substrate;
a projection system configured to project the patterned beam onto a target portion of the substrate; and
at least one purge gas supply system configured to provide a purge gas to at least part of the lithographic projection apparatus, the at least one purge gas supply system comprising:
a purge gas mixture generator comprising a moisturizer configured to add moisture to a purge gas, wherein the moisturizer comprises:
a) a bundle of a plurality of perfluorinated gas-permeable thermoplastic hollow fiber membranes having a first end and a second end and being substantially resistant to liquid intrusion, said membranes having an outer surface and an inner surface, said inner surface comprising a lumen;
b) each end of said bundle potted with a liquid tight perfluorinated thermoplastic seal forming a unitary end structure with a surrounding perfluorinated thermoplastic housing wherein the fiber ends are open to fluid flow;
c) said housing having an inner wall and an outer wall, wherein the inner wall defines a fluid flow volume between the inner wall and the hollow fiber membranes;
d) said housing comprising a purge gas inlet connected to a purge gas source, and comprising a purge gas mixture outlet; and
e) said housing comprising a water inlet connected to a water source, and comprising a water outlet, wherein either the purge gas inlet is connected to the first end of the bundle and the purge gas mixture outlet is connected to the second end of the bundle or the water inlet is connected to the first end of the bundle and the water outlet is connected to the second end of the bundle,
the purge gas mixture generator configured to generate a purge gas mixture, which purge gas mixture comprises at least one purge gas and the moisture, the purge gas mixture generator being configured to add the moisture to the purge gas by further comprising a mass flow controller to control flow rate of the purge gas flow through the moisturizer and a pressure regulator to control flow of the water through the moisturizer such that the moisture is added to the purge gas; and
a purge gas mixture outlet connected to the purge gas mixture generator configured to supply the purge gas mixture to the at least part of the lithographic projection apparatus.

21. A method for providing a purge gas to at least part of a lithographic projection apparatus comprising:
an illuminator configured to provide a projection beam of radiation;
a support configured to support a patterning device, the patterning device configured to pattern the projection beam according to a desired pattern;
a substrate table configured to hold a substrate; and
a projection system configured to project the patterned beam onto a target portion of the substrate;
the method comprising:
generating a purge gas mixture which comprises at least one purge gas and moisture by adding moisture to a purge gas with a moisturizer, wherein the moisturizer comprises a first region containing a purge gas flow and a second region containing water wherein the first and second regions are separated by a gas-permeable membrane that forms a hollow fiber and is substantially resistant to liquid intrusion, one of the first and second regions being within the fiber and the other of the first and second regions being outside the fiber; and
supplying the purge gas mixture to at least a part of the lithographic projection apparatus;
the method further comprising controlling flow rate of the purge gas flow through the first region of the moisturizer with a mass flow controller and controlling flow of the water through the second region of the moisturizer with a pressure regulator such that the moisture is added to the purge gas.

22. A method for providing a purge gas to at least part of a lithographic projection apparatus comprising:
an illuminator configured to provide a projection beam of radiation;
a support configured to support a patterning device, the patterning device configured to pattern the projection beam according to a desired pattern;
a substrate table configured to hold a substrate; and
a projection system configured to project the patterned beam onto a target portion of the substrate;
the method comprising:
generating a purge gas mixture which comprises at least one purge gas and moisture by adding moisture to a purge gas with a moisturizer, wherein the moisturizer comprises:

a) a bundle of a plurality of perfluorinated gas-permeable thermoplastic hollow fiber membranes having a first end and a second end and being substantially resistant to liquid intrusion, said membranes having an outer surface and an inner surface, said inner surface comprising a lumen;
b) each end of said bundle potted with a liquid tight perfluorinated thermoplastic seal forming a unitary end structure with a surrounding perfluorinated thermoplastic housing wherein the fiber ends are open to fluid flow;
c) said housing having an inner wall and an outer wall, wherein the inner wall defines a fluid flow volume between the inner wall and the hollow fiber membranes;
d) said housing having a purge gas inlet connected to a purge gas source and a purge gas mixture outlet; and
e) said housing having a water inlet connected to a water source and a water outlet, wherein either the purge gas inlet is connected to the first end of the bundle and the purge gas mixture outlet is connected to the second end of the bundle or the water inlet is connected to the first end of the bundle and the water outlet is connected to the second end of the bundle, and supplying the purge gas mixture to at least a part of the lithographic projection apparatus;

the method further comprising controlling flow rate of the purge gas flow through the moisturizer with a mass flow controller and controlling flow of the water through the moisturizer with a pressure regulator such that the moisture is added to the purge gas.

23. The lithographic projection apparatus of claim 19, wherein the membrane is comprised of a thermoplastic polymer.

24. The lithographic projection apparatus of claim 19, wherein the membrane is comprised of a perfluorinated polymer.

25. The lithographic projection apparatus of claim 24, wherein the perfluorinated polymer is polytetrafluoroethylene.

26. The lithographic projection apparatus of claim 19, wherein the moisturizer comprises:
a) a bundle of a plurality of gas-permeable hollow fiber membranes having a first end and a second end, said membranes having an outer surface and an inner surface, said inner surface comprising one of the first and second regions;
b) each end of said bundle potted with a liquid tight seal forming an end structure with a surrounding housing wherein the fiber ends are open to fluid flow;
c) said housing having an inner wall and an outer wall, wherein the inner wall defines the other of the first and second regions between the inner wall and the hollow fiber membranes;
d) said housing comprising a purge gas inlet connected to a purge gas source, and comprising a purge gas mixture outlet; and
e) said housing comprising a water inlet connected to a water source, and comprising a water outlet, wherein either the purge gas inlet is connected to the first end of the bundle and the purge gas mixture outlet is connected to the second end of the bundle or the water inlet is connected to the first end of the bundle and the water outlet is connected to the second end of the bundle.

27. The lithographic projection apparatus of claim 20, further comprising a heating device for the water.

28. The lithographic projection apparatus of claim 20, wherein the purge gas source comprises a purifier device.

29. The lithographic projection apparatus of claim 28, wherein the purifier device is regenerable.

30. The lithographic projection apparatus of claim 29, wherein the purge gas source comprises two purifier devices and wherein the purifier devices are connected in parallel.

31. The lithographic projection apparatus of claim 20, wherein the hollow fiber membranes are selected from the group consisting of:
a) hollow fiber membranes having a porous skinned inner surface, a porous outer surface and a porous support structure between;
b) hollow fiber membranes having a non-porous skinned inner surface, a porous outer surface and a porous support structure between;
c) hollow fiber membranes having a porous skinned outer surface, a porous inner surface and a porous support structure between; and
d) hollow fiber membranes having a non-porous skinned outer surface, a porous inner surface and a porous support structure between.

32. The lithographic projection apparatus of claim 31, wherein the hollow fiber membrane outer diameter is about 350 microns to about 1450 microns.

33. The lithographic projection apparatus of claim 31, wherein the hollow fiber membranes are hollow fiber membranes having a porous skinned inner surface, a porous outer surface and a porous support structure between; or hollow fiber membranes having a porous skinned outer surface, a porous inner surface and a porous support structure between; and the porous skinned surface pores are from about 0.001 microns to about 0.005 microns in diameter.

34. The lithographic projection apparatus of claim 20, wherein the first and second ends of the bundle are potted with a liquid tight perfluorinated thermoplastic seal forming a single unitary end structure comprising both the first and second ends with a surrounding perfluorinated thermoplastic housing wherein the fibers of the ends are separately open to fluid flow.

35. The lithographic projection apparatus of claim 20, wherein said supply system is capable of operation at a purge gas flow rate of at least about 30 standard liters per minute and a temperature of at least about 90° C.

36. The lithographic projection apparatus of claim 20, wherein the purge gas mixture generator is heated for a sufficient length of time at a temperature sufficient to substantially remove compounds that volatilize at temperatures of about 100° C. or less.

37. The method of claim 17, wherein the membrane is comprised of a thermoplastic polymer.

38. The method of claim 17, wherein the membrane is comprised of a perfluorinated polymer.

39. The method of claim 38, wherein the perfluorinated polymer is polytetrafluoroethylene.

40. The method of claim 17, wherein the moisturizer comprises:
a) a bundle of a plurality of gas-permeable hollow fiber membranes having a first end and a second end, said membranes having an outer surface and an inner surface, said inner surface comprising one of the first and second regions;
b) each end of said bundle potted with a liquid tight seal forming an end structure with a surrounding housing wherein the fiber ends are open to fluid flow;
c) said housing having an inner wall and an outer wall, wherein the inner wall defines the other of the first and second regions between the inner wall and the hollow fiber membranes;

d) said housing comprising a purge gas inlet connected to a purge gas source, and comprising a purge gas mixture outlet; and e) said housing comprising a water inlet connected to a water source, and comprising a water outlet, wherein either the purge gas inlet is connected to the first end of the bundle and the purge gas mixture outlet is connected to the second end of the bundle or the water inlet is connected to the first end of the bundle and the water outlet is connected to the second end of the bundle.

41. The method of claim 18, wherein the water is heated in or prior to entering the moisturizer.

42. The method of claim 18, wherein the purge gas source comprises a purifier device.

43. The method of claim 42, wherein the purifier device is regenerable.

44. The method of claim 43, wherein the purge gas source comprises first and second purifier devices and wherein the purifier devices are connected in parallel.

45. The method of claim 44, wherein the purge gas is purified by either the first or the second purifier device and wherein the other purifier device is regenerated.

46. The method of claim 18, wherein the hollow fiber membranes are selected from the group consisting of:

a) hollow fiber membranes having a porous skinned inner surface, a porous outer surface and a porous support structure between;

b) hollow fiber membranes having a non-porous skinned inner surface, a porous outer surface and a porous support structure between;

c) hollow fiber membranes having a porous skinned outer surface, a porous inner surface and a porous support structure between; and d) hollow fiber membranes having a non-porous skinned outer surface, a porous inner surface and a porous support structure between.

47. The method of claim 46, wherein the hollow fiber membrane outer diameter is about 350 microns to about 1450 microns.

48. The method of claim 46, wherein the hollow fiber membranes are hollow fiber membranes having a porous skinned inner surface, a porous outer surface and a porous support structure between or hollow fiber membranes having a porous skinned outer surface, a porous inner surface and a porous support structure between and the porous skinned surface pores are from about 0.001 microns to about 0.005 microns in diameter.

49. The method of claim 18, wherein the first and second ends of the bundle are potted with a liquid tight perfluorinated thermoplastic seal forming a single unitary end structure comprising both the first and second ends with a surrounding perfluorinated thermoplastic housing wherein the fibers of the ends are separately open to fluid flow.

50. The method of claim 18, wherein the temperature of the water is at least about 30° C.

51. The method of claim 50, wherein the temperature of the water is at least about 50° C.

52. The method of claim 18, wherein the flow rate of the purge gas is at least about 20 standard liters per minute.

53. The method of claim 52, wherein the flow rate of the purge gas is at least about 60 standard liters per minute.

54. The method of claim 18, wherein the relative humidity of the humidified purge gas is at least about 20%.

55. The method of claim 54, wherein the relative humidity of the humidified purge gas is at least about 50%.

56. The method of claim 55, wherein the humidified purge gas is substantially saturated with moisture.

57. The method of claim 18, wherein the purge gas entering the moisturizer comprises no greater than about 1 part per billion (ppb) contaminants and wherein the humidified purge gas leaving the moisturizer comprises no greater than about 1 ppb contaminants.

58. The method of claim 57, wherein the purge gas entering the moisturizer comprises no greater than about 100 parts per trillion (ppt) contaminants and wherein the humidified purge gas leaving the moisturizer comprises no greater than about 100 ppt contaminants.

59. The method of claim 58, wherein the purge gas entering the moisturizer comprises no greater than about 1 ppt contaminants and wherein the humidified purge gas leaving the moisturizer comprises no greater than about 1 ppt contaminants.

60. A purge gas mixture supply system, comprising:

a purge gas mixture generator comprising a moisturizer configured to add moisture to a purge gas, wherein said moisturizer comprises a first region containing a purge gas flow and a second region containing water wherein the first and second regions are separated by a membrane contactor;

the purge gas mixture generator being configured to add the moisture to the purge gas by further comprising a mass flow controller to control flow rate of the purge gas flow through the first region of the moisturizer and a pressure regulator to control flow of the water through the second region of the moisturizer such that the moisture is added to the purge gas to create a humidified purge gas mixture; and a purge gas mixture outlet being connected to the purge gas mixture generator to supply the humidified purge gas mixture to at least part of a lithographic projection apparatus.

61. The supply system of claim 60, wherein the membrane contactor comprises a perfluorosulfonic acid polytetrafluoroethylene copolymer membrane.

62. The supply system of claim 60, wherein the membrane contactor comprises a membrane comprising a substance suitable for use as a fuel cell humidifier.

63. The supply system of claim 60, wherein the membrane contactor comprises an ionomer.

64. The supply system of claim 62, wherein the membrane contactor comprises a sulfonated tetrafluoroethylene based fluoropolymer-copolymer membrane.

65. The supply system of claim 64, wherein the membrane contactor comprises a perfluorosulfonic acid polytetrafluoroethylene copolymer membrane.

66. The supply system of claim 60, further comprising a heating device for the water.

67. The supply system of claim 60, further comprising a purifier device for a purge gas source.

68. The supply system of claim 67, wherein the purifier device is regenerable.

69. The supply system of claim 68, wherein the purge gas source comprises two purifier devices and wherein the purifier devices are connected in parallel.

70. The supply system of claim 60, wherein said supply system is capable of operation at a purge gas flow rate of at least about 30 standard liters per minute and a temperature of at least about 90° C.

71. The supply system of claim 60, wherein the purge gas mixture generator is heated for a sufficient length of time at a temperature sufficient to substantially remove compounds that volatilize at temperatures of about 100° C. or less.

72. The supply system of claim 60, wherein the relative humidity of the humidified purge gas is at least about 50%.

73. The supply system of claim 60, wherein the purge gas entering the moisturizer comprises no greater than about 1 part per billion (ppb) contaminants and wherein the humidified purge gas leaving the moisturizer comprises no greater than about 1 ppb contaminants.

* * * * *